United States Patent
Gorecki et al.

(10) Patent No.: US 9,673,972 B2
(45) Date of Patent: *Jun. 6, 2017

(54) PHASE INTERPOLATOR

(71) Applicant: INPHI CORPORATION, Santa Clara, CA (US)

(72) Inventors: James L. Gorecki, Hillsboro, OR (US); Jiayun Zhang, Thousand Oaks, CA (US); Marcial K. Chua, Thousand Oaks, CA (US); Cosmin Iorga, Newbury Park, CA (US)

(73) Assignee: INPHI CORPORATION, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/283,735

(22) Filed: Oct. 3, 2016

(65) Prior Publication Data

US 2017/0026167 A1   Jan. 26, 2017

Related U.S. Application Data

(63) Continuation of application No. 14/872,327, filed on Oct. 1, 2015, now Pat. No. 9,485,086, which is a
(Continued)

(51) Int. Cl.
*H04L 7/04* (2006.01)
*H03K 5/01* (2006.01)
(Continued)

(52) U.S. Cl.
CPC .............. *H04L 7/04* (2013.01); *H03K 5/01* (2013.01); *H03K 5/135* (2013.01); *H03L 7/00* (2013.01);
(Continued)

(58) Field of Classification Search
CPC ......... H03K 5/135; H03K 2005/00052; H03K 5/01; H03K 2005/00286; H03L 7/00;
(Continued)

(56) References Cited

U.S. PATENT DOCUMENTS 8,754,678 B1 * 6/2014 Schell .................... H03B 28/00
327/106
2010/0026349 A1 * 2/2010 Jiang ..................... H03B 28/00
327/129
(Continued)

*Primary Examiner* — Young T Tse
(74) *Attorney, Agent, or Firm* — Richard T. Ogawa; Ogawa P.C.

(57) ABSTRACT

Apparatus to implement several high performance phase interpolators are disclosed. Some embodiments are directed to a full-wave integrating phase interpolation core comprising two pairs of in-phase and quadrature-phase current DACs arranged in a cascode architecture to drive an integrating capacitor and produce an interpolation voltage waveform. The current DACs are biased, weighted, and controlled by in-phase and quadrature-phase input clocks to yield an interpolation waveform that presents a phase value between the phases of the input clocks. Some embodiments deploying the interpolator core use feedback circuitry and reference voltages to adjust the common mode and amplitude of the interpolation voltage waveform to obtain both optimal performance and operation within the interpolator linear region or output compliance range. Both the single-core and dual-core implementations, as well as other implementations of the interpolator core, exhibit high power supply rejection, highly linear interpolation, a wide frequency range, and low cost duty cycle correction.

17 Claims, 17 Drawing Sheets

Related U.S. Application Data continuation of application No. 14/477,696, filed on Sep. 4, 2014, now Pat. No. 9,160,345.

(51) Int. Cl.
| | |
|---|---|
| *H03K 5/135* | (2006.01) |
| *H03L 7/00* | (2006.01) |
| *H03L 7/06* | (2006.01) |
| *H03L 7/08* | (2006.01) |
| *H03K 5/00* | (2006.01) |

(52) U.S. Cl.
CPC .. *H03L 7/0807* (2013.01); *H03K 2005/00052* (2013.01); *H03K 2005/00286* (2013.01)

(58) Field of Classification Search
CPC ....... H03L 7/07; H03L 7/0802; H03L 7/0807; H04L 7/00; H04L 7/0079; H04L 7/04; H04L 27/18; H04L 27/22; H04L 27/2271; H04L 27/2273; H04L 27/2275
USPC ....... 375/279–281, 324, 326, 329, 332, 371, 375/373; 327/231, 237–239, 243, 244, 327/355–359; 708/313
See application file for complete search history.

(56) References Cited

U.S. PATENT DOCUMENTS

| | | | | |
|---|---|---|---|---|
| 2010/0026367 A1* | 2/2010 | Jiang | ...................... | H03B 28/00 327/355 |
| 2015/0271005 A1* | 9/2015 | Wang | .................. | H04L 27/3405 375/254 |

\* cited by examiner

PHASE INTERPOLATOR

The present invention is a continuation of and claims priority to U.S. application Ser. No. 14/872,327 filed Oct. 1, 2015, which is a continuation of and claims priority to U.S. patent application Ser. No. 14/477,696, filed Sep. 4, 2014 (now U.S. Pat. No. 9,160,345 issued on Oct. 13, 2015), entitled "PHASE INTERPOLATOR", commonly assigned, and hereby incorporated by reference herein.

BACKGROUND

Data communication speeds in electronic systems continue to increase well into multiple Gbps (gigabits per second). Such speeds are prevalent in systems deploying serial data communication PHYs (physical layers) and in standards that include physical layer specifications (e.g., PCIe1/2/3, SATA 1/2/3, GbE, XAUI/2xXAUI, 10GBase-KR, Interlaken, USB 2/3, etc.) as well as in memory data standards for interfaces (e.g., DDR3, DDR4, LPDDR3, LPDDR4, etc.). At these speeds, clock and data recovery (CDR) circuitry is required to accurately (with low bit-error rate) recover the received data. Many CDR circuits include phase interpolators to enable adjustment of the phase of the clock or clocks used to sample or re-time the incoming data stream.

Unfortunately, legacy phase interpolators have limited capabilities. As data speeds increase and power budgets decrease in electronic systems, particularly in mobile or battery-powered applications, circuits must also scale to lower power consumption levels and accommodate more sophisticated power management schemes that deploy lower supply voltages, increased power state switching. Such circuits may be subjected to the presence of relatively higher power supply noise. Legacy phase interpolators have not scaled with today's power requirements both in terms of power consumption and power supply rejection (PSR). Further, legacy phase interpolators do not exhibit highly linear interpolation between phases, which limits phase adjustment accuracy and can be insufficient for higher speed data. Legacy phase interpolators are also limited in the frequency range over which the interpolator can be used, in turn limiting the re-use of the core design which is critical in today's fast time-to-market and cost sensitive electronics industry. Still worse, legacy phase interpolators deploy complicated phase and duty cycle adjustment techniques that require significant integrated circuit area and potentially longer calibration and test times.

Techniques are needed to address the problem of implementing a low power phase interpolator that exhibits high power supply rejection, highly linear interpolation, over a wide frequency range, and exhibiting low cost duty cycle distortion.

None of the aforementioned legacy approaches achieve the capabilities of the herein-disclosed high performance phase interpolators. Therefore, there is a need for improvements.

SUMMARY

The present disclosure provides improved systems and methods to address the aforementioned issues with legacy approaches. More specifically, the present disclosure provides a detailed description of techniques used in systems and methods for high performance phase interpolators. Some of the claimed embodiments address the problem of implementing a low power phase interpolator that exhibits high power supply rejection, highly linear interpolation, a wide frequency range of operation, and low cost duty cycle correction. More specifically, some claims are directed to approaches for combining two full-wave integrating phase interpolation cores with feedback to form a pseudo-differential interpolator architecture with duty cycle control. Such claims advance the technical fields for addressing the problem of implementing low power phase interpolators, as well as advancing peripheral technical fields. Some claims improve the functioning of multiple systems within the disclosed environments.

Some embodiments of the present disclosure are directed to a full-wave integrating phase interpolation core comprising a pair of in-phase and quadrature-phase digitally-controlled current sources (e.g., current DACs), and a pair of in-phase and quadrature-phase digitally-controlled current sinks (e.g., multiplying DACs), arranged in a cascode architecture to drive an integrating capacitor and produce an interpolation voltage waveform (e.g., triangle wave). The current sources and current sinks are biased, weighted, and controlled by in-phase and quadrature-phase input clocks to yield an interpolation waveform that represents a phase interpolated between the phases of the input clocks. Some embodiments deploying the interpolator core use feedback circuitry (e.g. switched capacitor feedback, linear feedback, etc.) and digitally-controlled reference voltages to adjust the common mode and amplitude of the interpolation voltage waveform to obtain highly-tuned performance and operation within the interpolator linear region or output compliance range. The interpolation core can be deployed in a single-core implementation with a comparator output stage that compares the interpolation voltage waveform to a digitally-controlled reference voltage to produce an interpolation clock output. The interpolation core can also be deployed in a dual-core implementation that generates a pseudo-differential interpolation voltage waveform that a comparator can convert to an interpolation clock output. Both the single-core and dual-core implementations, as well as other implementations of the interpolator core, exhibit high power supply rejection, highly linear interpolation, a wide frequency range, and low cost duty cycle correction.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings, described below, are for illustration purposes only. The drawings are not intended to limit the scope of the present disclosure.

DETAILED DESCRIPTION

Overview

Figure 1:
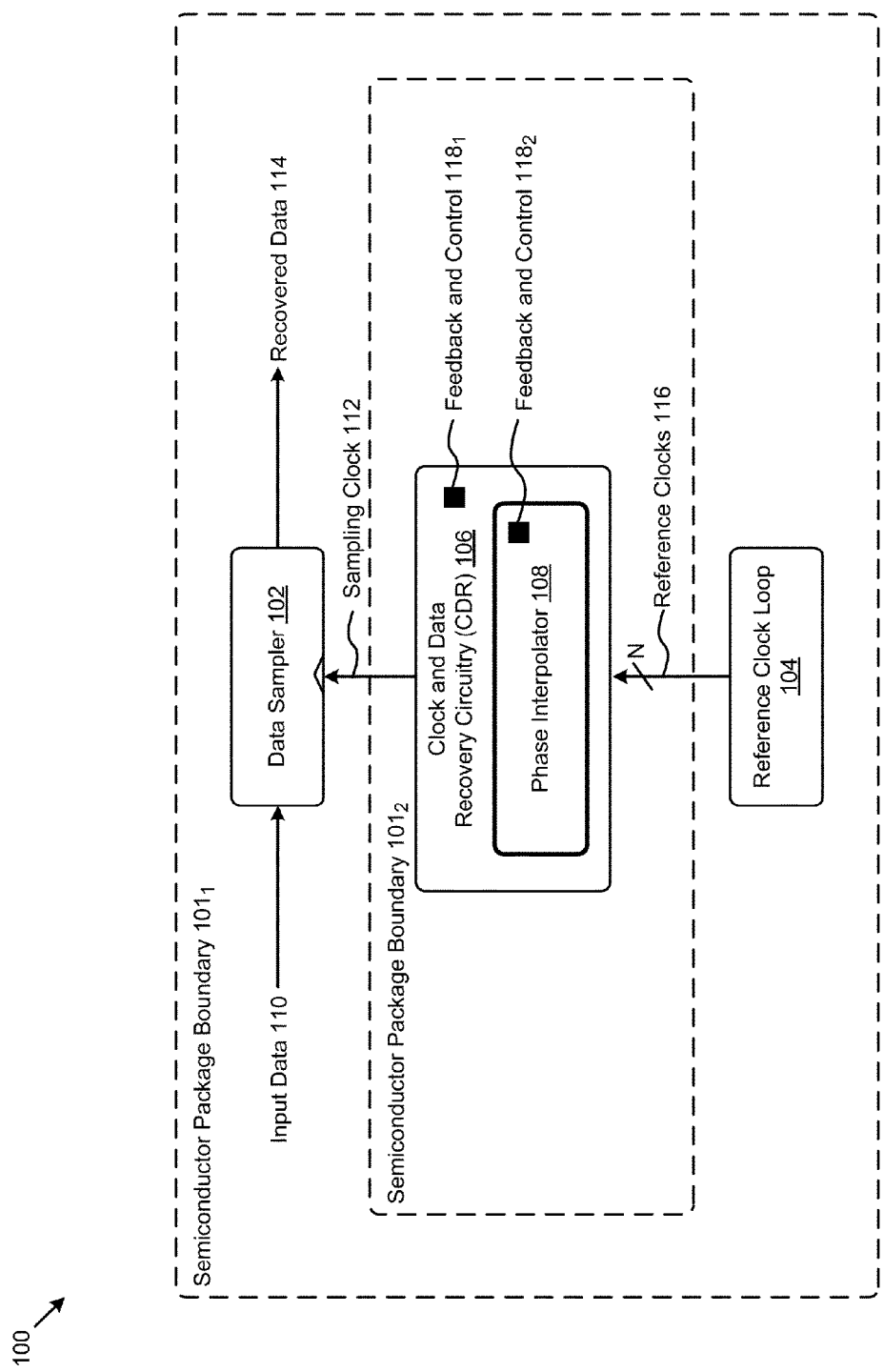
FIG. 1 depicts a data receiver system in an environment that includes a phase interpolator.

High speed data communication in electronic systems requires CDR circuitry with phase interpolators to accurately recover received data. The legacy phase interpolators deployed today, however, have limited capability. For example, legacy phase interpolators have not scaled with today's power requirements both in terms of power consumption and power supply rejection or "PSR". Further, legacy phase interpolators do not exhibit highly linear interpolation between phases, which limits phase adjustment accuracy and can be insufficient for higher speed data. Legacy phase interpolators are also limited in the frequency range over which the interpolator can be used, in turn limiting the re-use of the core design which is critical in today's fast time-to-market and cost sensitive electronics industry. Finally, legacy phase interpolators deploy complicated phase and duty cycle adjustment techniques that require significant chip area and potentially longer calibration and test times, all contributing to overall chip costs.

Some embodiments of the present disclosure address the problem of implementing a low power phase interpolator that exhibits high power supply rejection, highly linear interpolation, a wide frequency range, and low cost duty cycle correction and some embodiments are directed to approaches for combining two full-wave integrating phase interpolation cores with feedback to form a pseudo-differential interpolator architecture. More particularly, disclosed herein and in the accompanying figures are exemplary environments, methods, and systems for high performance phase interpolators.

Some embodiments of the present disclosure are directed to a full-wave integrating phase interpolation core comprising a pair of in-phase and quadrature-phase digitally-controlled current sources (e.g., current DACs), and a pair of in-phase and quadrature-phase digitally-controlled current sinks (e.g., multiplying DACs), arranged in a cascode architecture to drive an integrating capacitor and produce an interpolation voltage waveform (e.g., triangle wave). The current sources and current sinks are biased, weighted, and controlled by in-phase and quadrature-phase input clocks to yield an interpolation waveform that represents a phase interpolated between the phases of the input clocks. Some embodiments deploying the interpolator core use feedback circuitry (e.g. switched capacitor feedback, linear feedback) and digitally-controlled reference voltages to adjust the common mode and amplitude of the interpolation voltage waveform to obtain both optimal performance and operation within the interpolator linear region or output compliance range. The interpolation core can be deployed in a single-core implementation with a comparator output stage that compares the interpolation voltage waveform to a digitally-controlled reference voltage to produce an interpolation clock output. The interpolation core can also be deployed in a dual-core implementation that generates a pseudo-differential interpolation voltage waveform that a comparator can convert to an interpolation clock output. Both the single-core and dual-core implementations, as well as other implementations of the interpolator core, exhibit high power supply rejection, highly linear interpolation, a wide frequency range, and low cost duty cycle correction.

DEFINITIONS

Some of the terms used in this description are defined below for easy reference. The presented terms and their respective definitions are not rigidly restricted to these definitions—a term may be further defined by the term's use within this disclosure.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

Descriptions of Exemplary Embodiments

FIG. 1 depicts a data receiver system 100 that includes a phase interpolator.

As shown in FIG. 1, system 100 comprises a data sampler 102, a reference clock loop 104, and a clock and data recovery circuit 106 (CDR) including a phase interpolator 108. System 100 can be implemented as a stand-alone chip, a system-on-chip ("SOC"), or larger electronic system. System 100 can also be representative of similar systems in a variety of environments and applications, such as serial data communication links and memory data interfaces. System 100 illustrates that input data 110 from such environments and applications is received by data sampler 102 and sampled according to the timing and phase attributes of a sampling clock 112 to produce recovered data 114. Sampling clock 112 can comprise more than one signal (e.g., data clock and edge clock) depending on the design requirements of data sampler 102. Sampling clock 112 is generated by CDR circuit 106 utilizing multiple reference clocks 116 having varying phases and produced by reference clock loop 104. Phase interpolator 108 is a critical component of CDR circuit 106 and system 100 in that it generates and controls the timing and phase of sampling clock 112 required for an accurate sampling and recovery of input data 110. Phase interpolator 108 accomplishes this, in part, by controlled interpolation of the phases of reference clocks 116 provided by reference clock loop 104. Phase interpolator 108 can also require various feedback and control signals 118 to provide the required sampling clock 112. Feedback and control signals 118 can originate internally (e.g., from feedback and control $118_1$) and/or can originate or derive from a local component (e.g., from feedback and control $118_2$) and/or can originate or derive from an external source.

The system 100 can be implemented in a semiconductor package, and the semiconductor package may include components in addition to the elements shown in FIG. 1. For example, a semiconductor package may have a boundary (e.g., semiconductor package boundary $101_1$) within which is disposed a memory core and/or a decoder core. In some situations, a semiconductor package might comprise an integrated transceiver circuit device that might have a relatively smaller boundary (e.g., semiconductor package boundary $101_2$) within which is disposed one or more components in addition to the shown CDR circuitry.

Figure 2A:
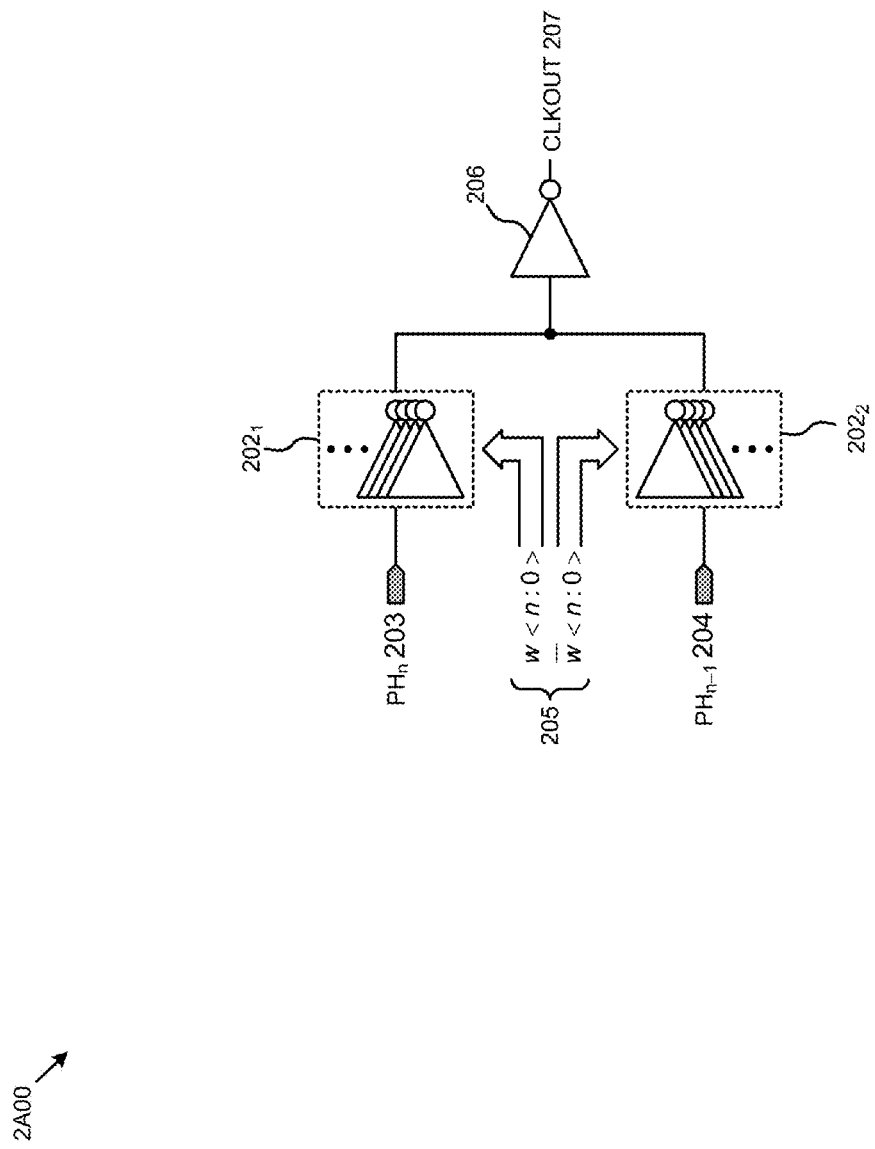
FIG. 2A presents a diagram of a digital phase interpolator.

FIG. 2A is a diagram of a digital phase interpolator 2A00. As an option, one or more instances of digital phase interpolator 2A00 or any aspect thereof may be implemented in the context of the architecture and functionality of the embodiments described herein. Also, digital phase interpolator 2A00 or any aspect thereof may be implemented in any desired environment.

As shown in FIG. 2A, digital phase interpolator 2A00 comprises a first selectable clock buffer set $202_1$, a second selectable clock buffer set $202_2$, and an output clock buffer 206. First clock buffer set $202_1$ receives at each buffer input of set $202_1$ a clock signal $ph_n$ 203 having a first phase, and second clock buffer set $202_2$ receives at each buffer input of set $202_2$ a clock signal $ph_{n-1}$ 204 having a second phase. The outputs of each buffer in first clock buffer set $202_1$ and second clock buffer set $202_2$ are summed or mixed at output clock buffer 206 to provide an output clock signal clkout 207 having an interpolated phase. Each buffer in clock buffer sets $202_1$ and $202_2$ is controlled (e.g., enabled or disabled) by a set of digital buffer control signals 205 having a separate control signal for each buffer in set $202_1$ and a corresponding complement control signal for each buffer in set $202_2$. For example, if clock buffer sets $202_1$ and $202_2$ each have sixteen buffers, the digital buffer control signals 205 will comprise sixteen digital signals to control set $202_1$ and the complement of those sixteen digital signals to control set $202_2$. By selecting various combinations of control signals 205, or "weighting" the clock buffers, the clock buffers will compete or "jam" each other to produce a clock signal clkout 207 having a phase between the phase of clock signal $ph_n$ 203 and the phase of clock signal $ph_{n-1}$ 204.

Figure 2B:
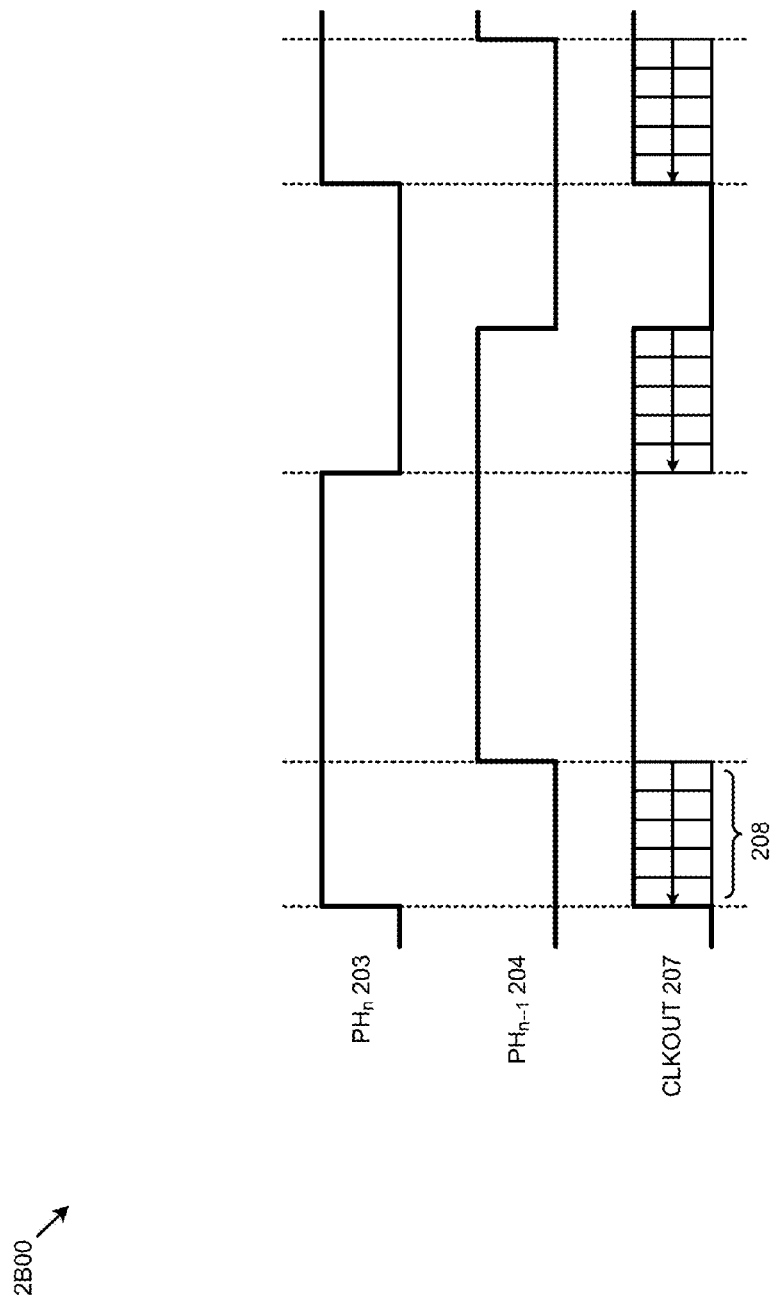
FIG. 2B depicts selected waveforms of a digital phase interpolator.

FIG. 2B depicts selected waveforms 2B00 of a digital phase interpolator. As shown in FIG. 2B, waveforms 2B00 comprises timing diagrams for clock signals $ph_n$ 203, $ph_{n-1}$ 204, and clkout 207 from digital phase interpolator 2A00. As different combinations or weighting of control signals 205 are selected, the phase of clkout 207 will traverse a clkout phase range 208 from the phase of $ph_{n-1}$ 204 to the phase of $ph_n$ 203. The adjustment of phases across clkout phase range 208 of digital phase interpolator 2A00 is known to have poor linearity and be limited in overall phase adjustment range (e.g., the difference between $ph_{n-1}$ and $ph_n$). The design of digital phase interpolator 2A00 and similar interpolators also exhibit high power dissipation and low PSR. These performance metrics, along with chip costs (e.g., due to chip area), are degraded further as digital phase interpolator 2A00 is scaled to more precise phase adjustment resolutions.

Figure 3A:
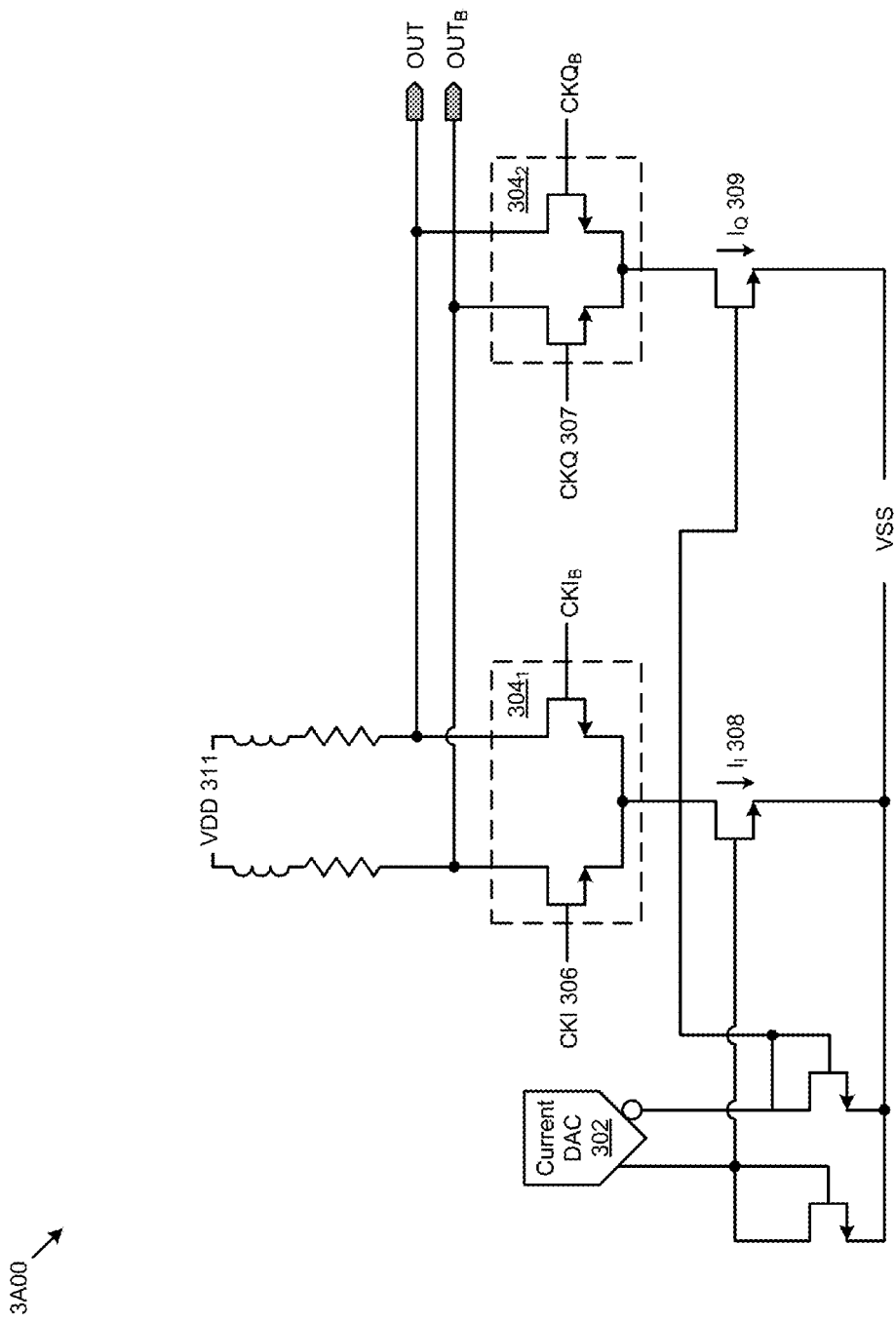
FIG. 3A is a schematic of a trigonometric phase interpolator.

FIG. 3A is a schematic of a trigonometric phase interpolator 3A00. As an option, one or more instances of trigonometric phase interpolator 3A00 or any aspect thereof may be implemented in the context of the architecture and functionality of the embodiments described herein. Also, trigonometric phase interpolator 3A00 or any aspect thereof may be implemented in any desired environment.

As shown in FIG. 3A, trigonometric phase interpolator 3A00 comprises a weighted current DAC 302, an in-phase clock gate $304_1$, and a quadrature-phase clock gate $304_2$. Current DAC 302 is controlled to provide weighted or "steering" currents $I_I$ 308 and $I_Q$ 309 to in-phase clock gate $304_1$ and quadrature-phase clock gate $304_2$, respectively. In-phase clock gate $304_1$ receives an in-phase clock signal CKI 306 (and its differential complement $CKI_B$), and quadrature-phase clock gate $304_2$ receives a quadrature-phase clock signal CKQ 307 (and its differential complement $CKQ_B$). The outputs of clock gates $304_1$ and $304_2$ or weighted currents $I_I$ 308 and $I_Q$ 309, respectively, are summed or mixed according to the level of clock signals CKI 306 and CKQ 307, respectively, to provide an interpolated output clock signal OUT 310 (and its differential complement $OUT_B$). When clock signals CKI 306 and CKQ 307 are sinusoidal, interpolated clock signal OUT 310 will be determined by:

$$OUT(t) = A\cos(\phi)\sin(\omega t) - A\sin(\phi)\cos(\omega t) \quad [\text{EQ. 1}]$$

where,
CKI(t)=A sin(ωt),
CKQ(t)=A sin(ωt−π/2)=−A cos(ωt), and
0≤φ≤π/2, adjusted according to current DAC 302 settings.

Figure 3B:
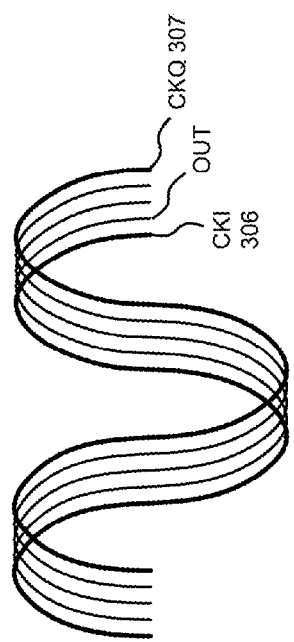
FIG. 3B depicts selected waveforms of a trigonometric phase interpolator.

FIG. 3B depicts selected waveforms 3B00 of trigonometric phase interpolator 3A00. As shown in FIG. 3B, waveforms 3B00 comprises representations of signals CKI 306, CKQ 307, and OUT 310 from trigonometric phase interpolator 3A00. The phase of OUT 310 will traverse from the phase of CKQ 307 to the phase of CKI 306 according to equation [EQ. 1] as different weighting of currents $I_I$ 308 and $I_Q$ 309 is established by current DAC 302 to determine ϕ. When operating according to equation [EQ. 1], trigonometric phase interpolator 3A00 exhibits good high frequency performance and phase step linearity. However, generation of sinusoidal inputs and conversion of the sinusoidal output to a digital clock can be costly (e.g., chip area, design resources, etc.) to implement. Further, trigonometric phase interpolator 3A00 has no inherent PSR as the output stage is directly coupled to the power supply VDD 311. PSR can be improved by implementing successive stages, but at the cost of additional chip area and design verification resources. As an alternative, signals CKI 306 and CKQ 307 can be digital signals rather than sinusoidal signals, with a shunt capacitor at output clock signal OUT 310 and its complement to provide an "integrating" type interpolator. However, while eliminating the need to source sinusoidal clock inputs, this solution can exhibit further degraded linearity, PSR, and output waveform distortion due to the saturation of input and output stages.

Figure 4A:
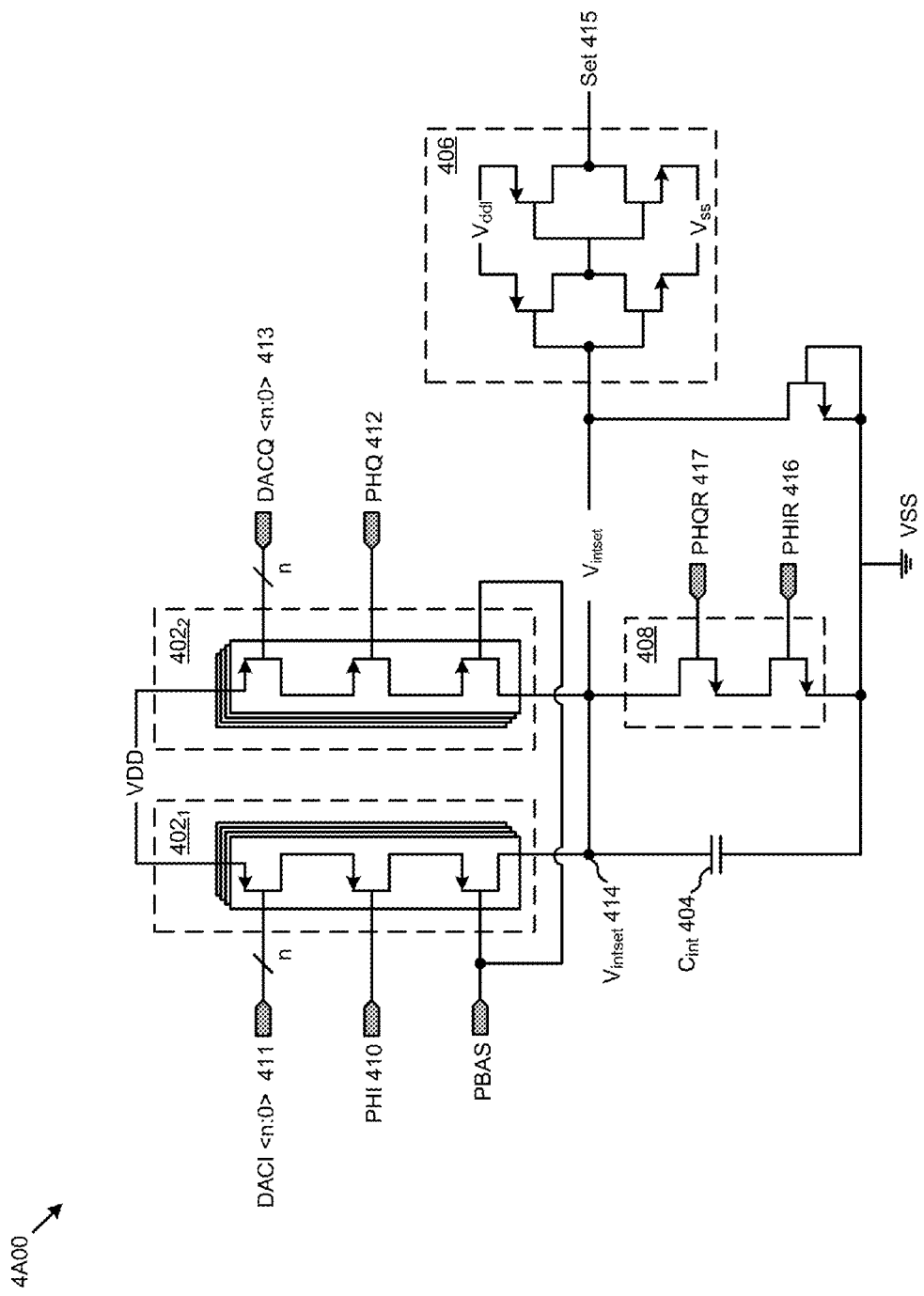
FIG. 4A is a schematic of a half-wave integrating phase interpolator.

FIG. 4A is a schematic of a half-wave integrating phase interpolator 4A00. As an option, one or more instances of half-wave integrating phase interpolator 4A00 or any aspect thereof may be implemented in the context of the architecture and functionality of the embodiments described herein. Also, half-wave integrating phase interpolator 4A00 or any aspect thereof may be implemented in any desired environment.

As shown in FIG. 4A, half-wave integrating phase interpolator 4A00 comprises an in-phase controlled current source $402_1$, a quadrature-phase controlled current source $402_2$, an integrating capacitor $C_{INT}$ 404, an output clock buffer 406, and a reset circuit 408. In-phase controlled current source $402_1$ receives an in-phase clock signal phi 410 and a set of in-phase current control signals daci 411. Quadrature-phase controlled current source $402_2$ receives a quadrature-phase clock signal phq 412 and a set of quadrature-phase current control signals dacq 413. In this configuration, current sources $402_1$ and $402_2$ function as current DACs, controlled by digital signals at daci 411 and dacq 413. The number (e.g., 30) of control signals daci 411 and dacq 413 depends on the current adjustment precision required for half-wave integrating phase interpolator 4A00. The currents from each current source $402_1$ and $402_2$ are summed or mixed in integrating capacitor $C_{int}$ 404 which in turn stores the energy to support a voltage $V_{intset}$ 414. Voltage $V_{intset}$ 414 drives output clock buffer 406 to produce an amplified and limited output pulse signal set 415 when $V_{intset}$ 414 is greater than the inherent switching threshold voltage of buffer 406. Reset circuit 408 receives an in-phase reset signal phir 416 and a quadrature-phase reset signal phqr 417. When both reset signals phir 416 and phqr 417 are high, the voltage across integrating capacitor $C_{int}$ 404 or voltage $V_{intset}$ 414 is "reset" to 0 volts.

Figure 4B:
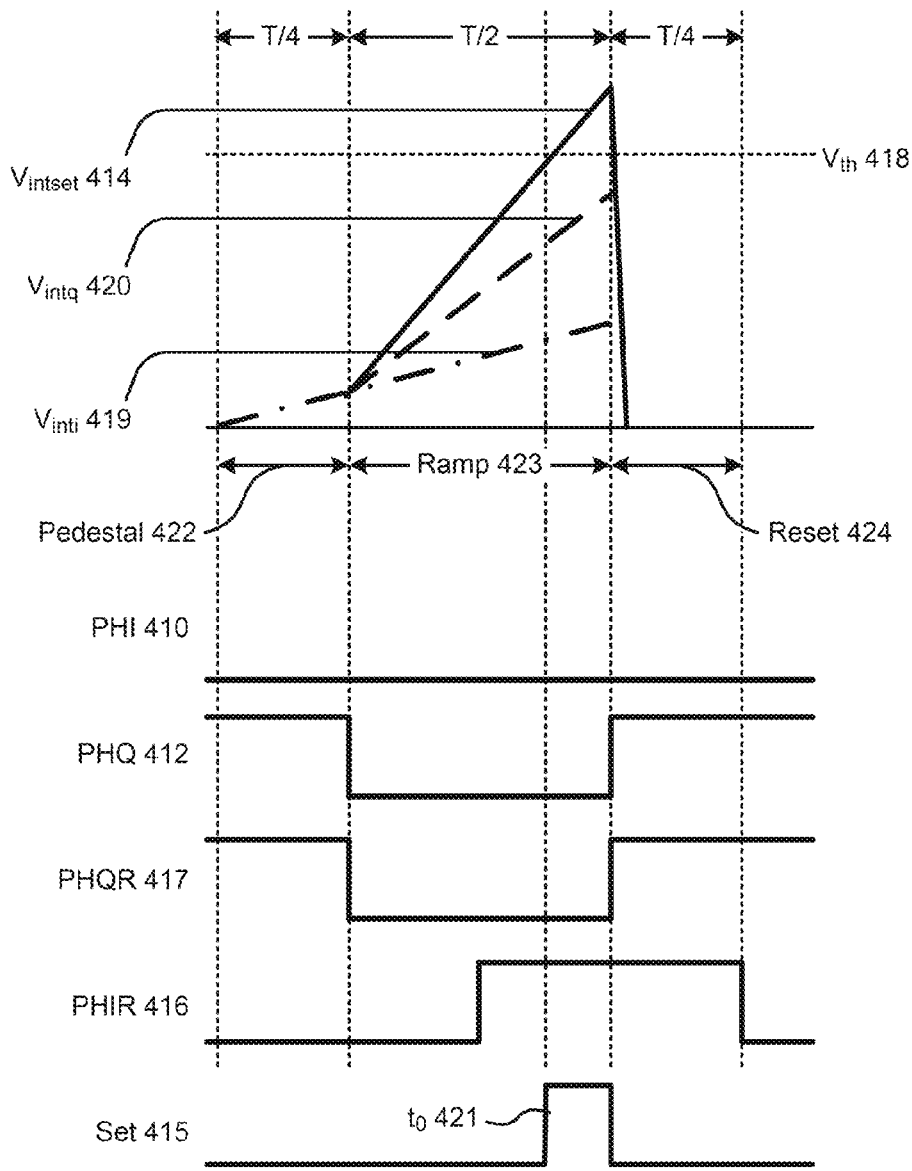
FIG. 4B depicts selected waveforms of a half-wave integrating phase interpolator.

FIG. 4B depicts selected waveforms 4B00 of a half-wave integrating phase interpolator 4A00. As shown in FIG. 4B, waveforms 4B00 comprises representations of signals phi 410, phq 412, phqr 417, phir 416, set 415, and $V_{intset}$ 414 from half-wave integrating phase interpolator 4A00. Waveforms 4B00 also introduces a voltage $V_{th}$ 418, the threshold voltage of output clock buffer 406. Output pulse signal set 415 of output clock buffer 406 will be in a low or high state when the input to buffer 406, or $V_{intset}$ 414, is lower or higher than $V_{th}$ 418, respectively. For illustrative purposes, waveforms 4B00 further shows an in-phase integration voltage $V_{inti}$ 419 and a quadrature-phase integration voltage $V_{intq}$ 420, representing the voltage contribution to $V_{intset}$ 414 from in-phase controlled current source $402_1$ and quadrature-phase controlled current source $402_2$, respectively.

The interpolation cycle of period T (e.g., equal to the data period) begins with a "pedestal" stage 422 during which only in-phase controlled current source $402_1$ is enabled by a low phi signal 410 and begins to charge capacitor $C_{int}$ 404 and ramp voltage $V_{intset}$ 414. After a time of T/4, a "ramp" stage 423 begins and signal phq 412 also goes low to enable quadrature-phase controlled current source $402_2$. During ramp stage 423, both voltage $V_{inti}$ 419 and voltage $V_{intq}$ 420 are contributing to voltage $V_{intset}$ 414. When voltage $V_{intset}$ 414 surpasses voltage $V_{th}$ 418, output pulse signal set 415 goes from low to high at a transition point $t_\phi$ 421. Transition point $t_\phi$ 421 defines the phase generated by half-wave integrating phase interpolator 4A00. In a final "reset" stage 424 of the interpolation cycle, reset signals phir 416 and phqr 417 both go high to reset voltage $V_{intset}$ 414 across integrating capacitor $C_{int}$ 404 to 0 volts and prepare the circuit for the next interpolation cycle. Waveforms 4B00 show a fixed reset stage 424 covering the last quarter of the cycle, but an asynchronous reset following the occurrence of transition $t_\phi$ 421 can also be implemented.

Transition $t_\phi$ 421 can be adjusted by adjusting the relative currents generated by current sources $402_1$ and $402_2$, which in turn change the slopes of voltages $V_{inti}$ 419 and $V_{intq}$ 420, respectively, and therefore the slope of their sum, voltage $V_{intset}$ 414. As the slope of $V_{intset}$ 414 varies against a fixed $V_{th}$ 418, transition point $t_\phi$ 421 will also vary. Due to the constant slope of $V_{intset}$ 414 during ramp stage 423, half-wave integrating phase interpolator 4A00 exhibits good phase step linearity. PSR of the core circuit of interpolator 4A00 is also good. However, operation of interpolator 4A00 as shown is not guaranteed by design, as manufacturing process variations and the like may result in voltage $V_{intset}$ 414 not crossing threshold voltage $V_{th}$ 418 during ramp stage 423, thus rendering interpolator 4A00 inoperable. Further, legacy interpolator designs similar to half-wave integrating phase interpolator 4A00 do not incorporate frequency dependent duty cycle offset tuning.

Figure 5:
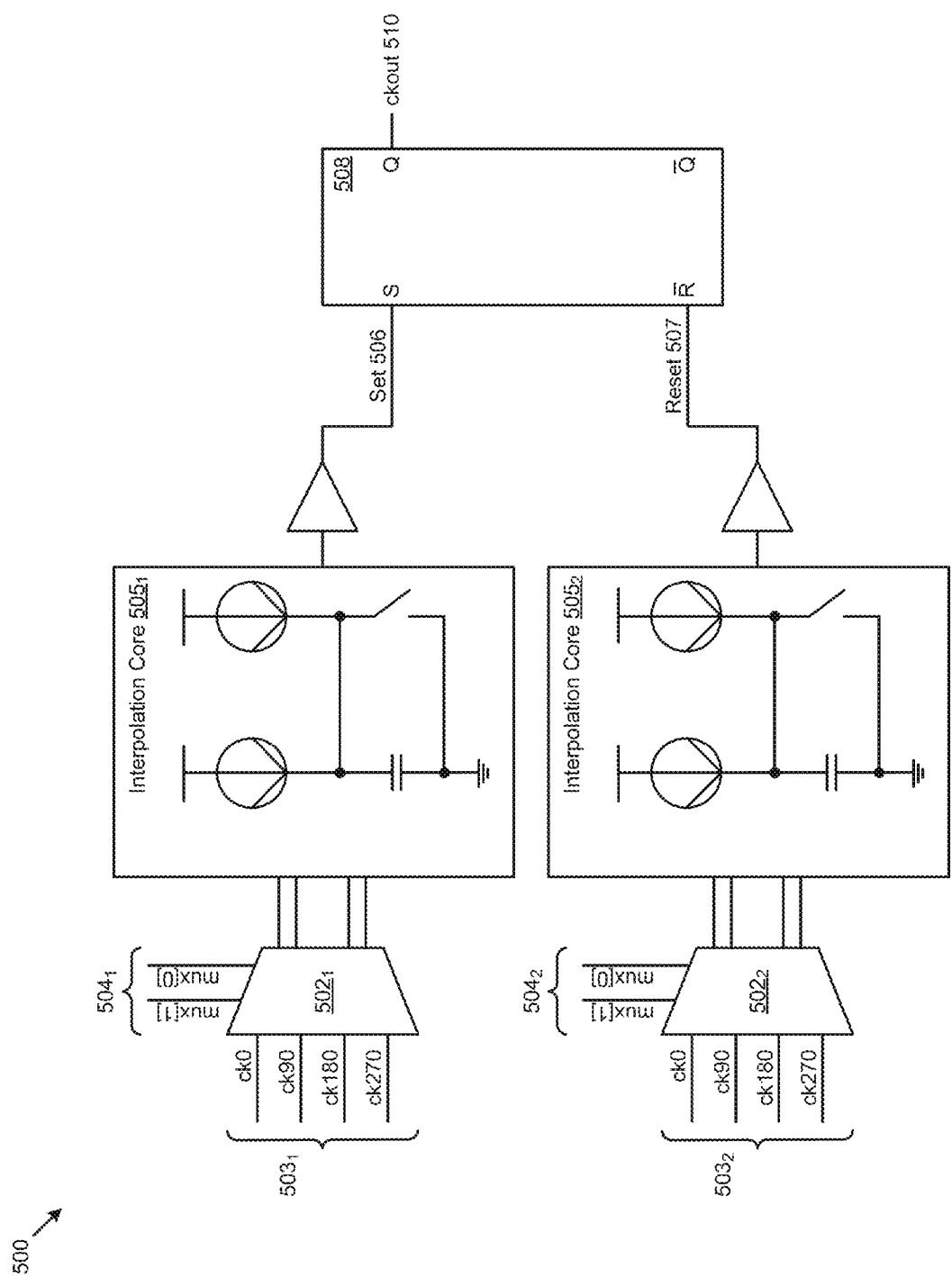
FIG. 5 presents a diagram of a dual-core half-wave integrating phase interpolator, according to some embodiments.

FIG. 5 presents a diagram of a dual-core half-wave integrating phase interpolator. A dual-core half-wave implementation 500 can be used to generate an interpolated clock with a 50% duty cycle. Implementation 500 comprises a first clock multiplexer $502_1$, a second clock multiplexer $502_2$, a first half-wave interpolation core $505_1$, a second half-wave interpolation core $505_2$, and an SR latch 508. Clock multiplexers $502_1$ and $502_2$ each receive a set of four reference clocks (e.g., set $503_1$ and set $503_2$,) respectively, where each of the four clocks in set $503_1$ and set $503_2$ are separated in phase by π/2 radians or 90 degrees. Clock multiplexers $502_1$ and $502_2$ also each receive a set of two mux control signals, signal $504_1$ and signal $504_2$, respectively, to select two reference clocks that will be passed through to interpolation cores $505_1$ and $505_2$. Interpolation cores $505_1$ and $505_2$ operate as described in FIGS. 4A and 4B to produce a set pulse 506 on the "set" or "S" input of SR latch 508 and a reset pulse 507 on the "reset" or "R" input of SR latch 508, respectively. Through the operation of SR latch 508, the timing of set pulse 506 and the timing of reset pulse 507 will produce the rising and falling edges, respectively, of a clock signal ckout 510, thus allowing for control of the duty cycle of ckout 510. While dual-core half-wave integrating phase interpolator 500 provides duty cycle control, SR latch 508 significantly degrades the PSR of the system.

Figure 6:
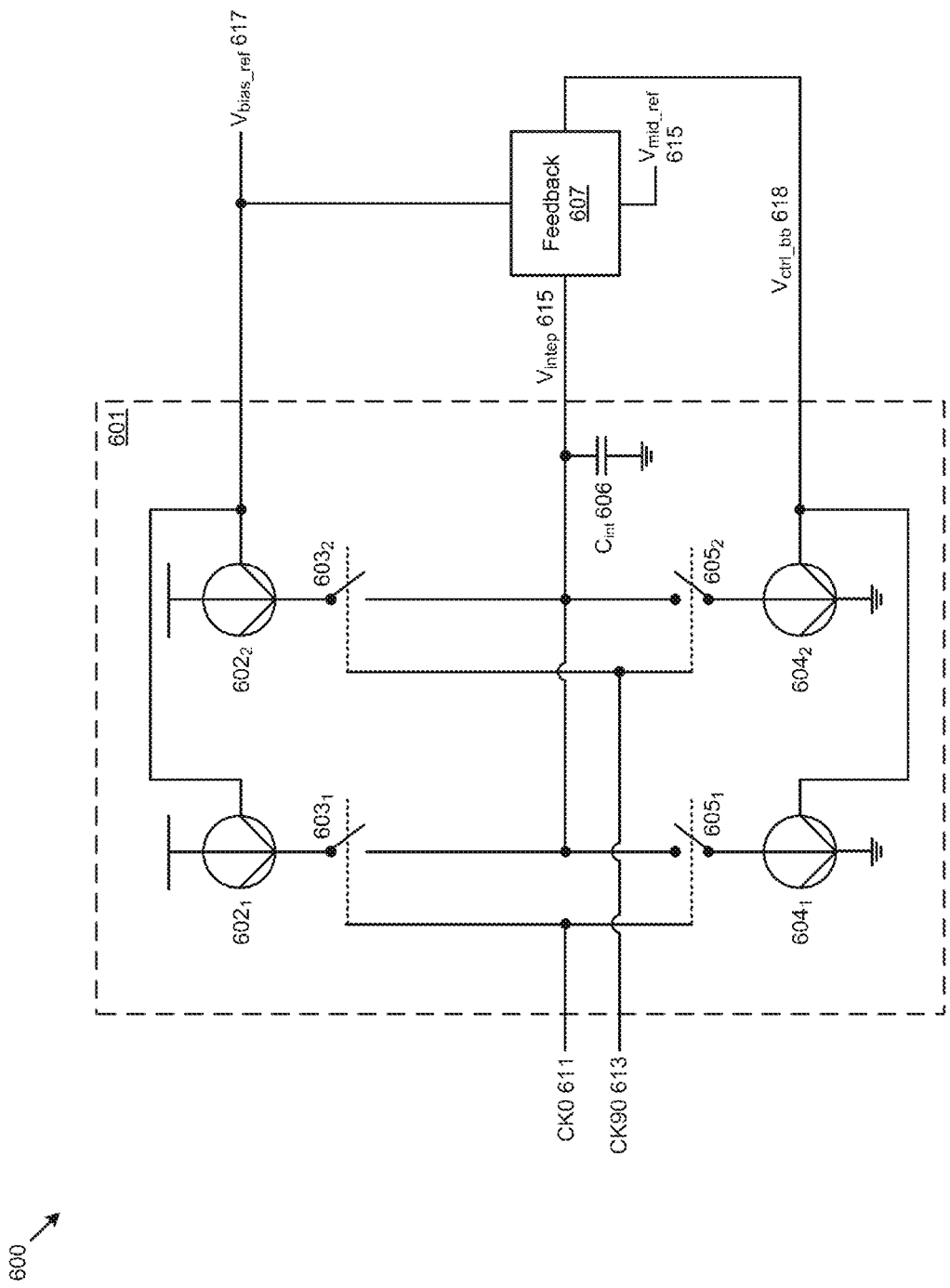
FIG. 6 is a functional diagram of a full-wave integrating phase interpolator as used to implement various high performance phase interpolators, according to some embodiments.

FIG. 6 is a functional diagram of a full-wave integrating phase interpolator 600 as used to implement various high performance phase interpolators. As an option, one or more instances of interpolator 600 or any aspect thereof may be implemented in the context of the architecture and functionality of the embodiments described herein. Also, interpolator 600 or any aspect thereof may be implemented in any desired environment.

As shown in FIG. 6, full-wave integrating phase interpolator 600 comprises a full-wave interpolation core 601 and a feedback circuit 607. Full-wave interpolation core 601 further comprises an in-phase current source $602_1$, a quadrature-phase current source $602_2$, an in-phase current sink $604_1$, a quadrature-phase current sink $604_2$, a first in-phase current switch $603_1$, a first quadrature-phase current switch $603_2$, a second in-phase current switch $605_1$, a second quadrature-phase current switch $605_2$, and an integrating capacitor $C_{int}$ 606. Switches $605_1$ and $603_1$ are controlled by an in-phase clock signal ck0 611, and switches $605_2$ and $603_2$ are controlled by a quadrature-phase clock signal ck90 613. The switches are closed and opened according to the state of the clock signals to source and sink current into and out of integrating capacitor $C_{int}$ 606 to produce an interpolation voltage $V_{intep}$ 615. Switches $605_1$ and $603_1$ can be configured to be in opposite positions (e.g., switch $605_1$ "closed" and switch $603_1$ "open") for a given state of in-phase clock signal ck0 611. Likewise, switches $605_2$ and $603_2$ can be configured to be in opposite positions (e.g., switch $605_2$ "closed" and switch $603_2$ "open") for a given state of quadrature-phase clock signal ck90 613. Current sources $602_1$ and $602_2$, and current sinks $604_1$ and $604_2$, are each digitally-controlled (e.g., current DACs, multiplying DACs) to provide a desired response or waveform (e.g., triangle wave) at $V_{intep}$ 615 throughout the entire interpolation cycle. In some embodiments, feedback circuit 607 receives voltage $V_{intep}$ 615, a midpoint reference voltage $V_{mid\_ref}$ 616, and a current bias reference voltage $V_{bias\_ref}$ 617, to produce a feedback voltage $V_{ctrl\_fb}$ 618. Feedback circuit 607 allows for optimization of the dynamic voltage range of full-wave interpolation core 601 through control of the common mode and amplitude of the waveform at $V_{intep}$ 615.

Figure 7:
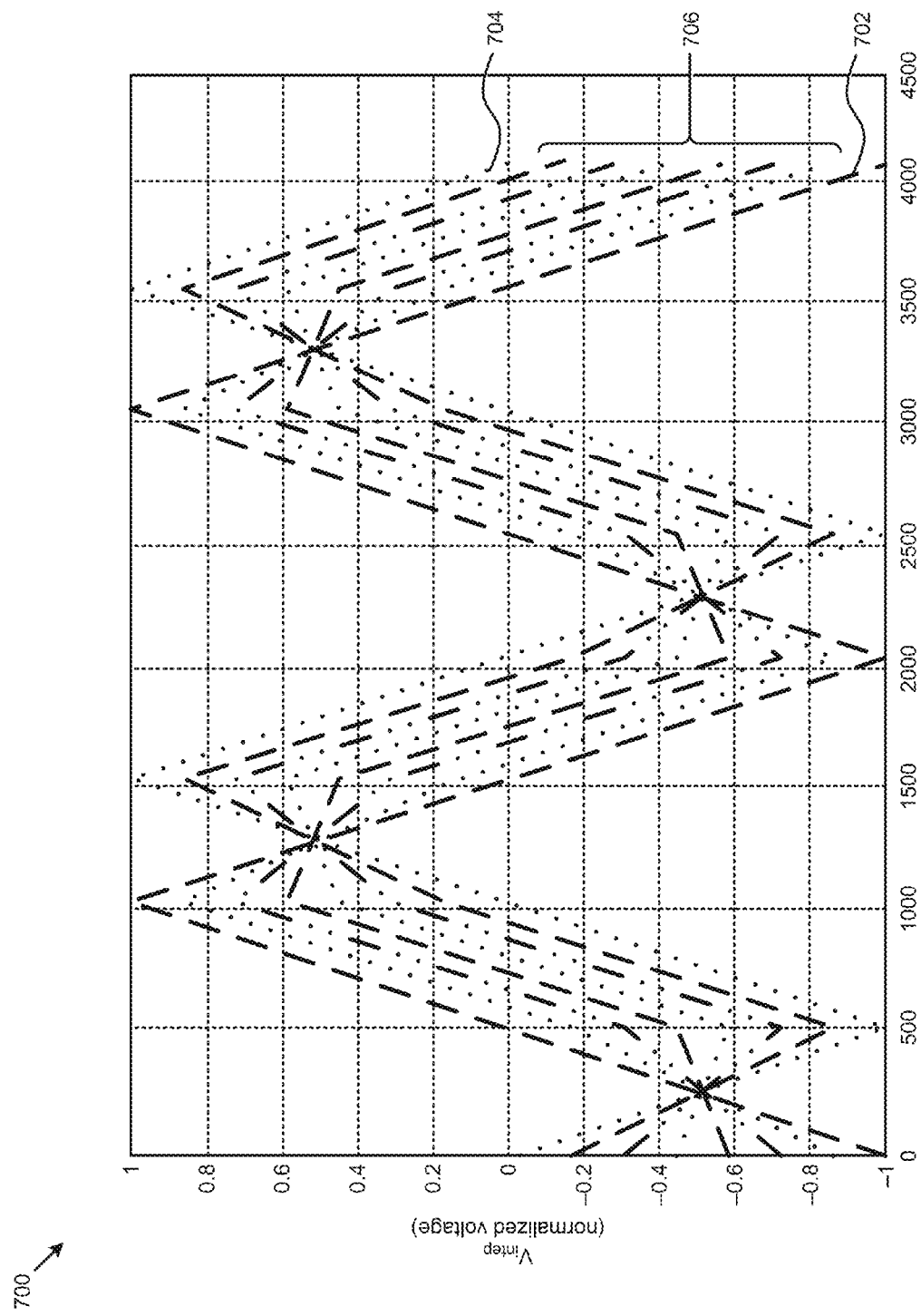
FIG. 7 depicts selected output waveforms of a full-wave integrating phase interpolator, according to some embodiments.

FIG. 7 depicts selected output waveforms 700 of full-wave integrating phase interpolator 600. Specifically, waveforms 700 represent the voltage at $V_{intep}$ 615 at various settings or weightings of current sources $602_1$ and $602_2$ and current sinks $604_1$ and $604_2$, in some embodiments. For example, a first waveform 702 can represent the voltage at $V_{intep}$ 615 when quadrature-phase current source $602_2$ and quadrature-phase current sink $604_2$ are biased and weighted such that changes in the state of quadrature-phase clock signal ck90 613, and subsequently, changes in the state of switches $605_2$ and $603_2$, have no impact on the voltage at $V_{intep}$ 615. First waveform 702 can therefore represent a pass through of the phase of in-phase clock signal ck0 611. Similarly, a second waveform 704 can represent the voltage at $V_{intep}$ 615 when in-phase current source $602_1$ and in-phase current sink $604_1$ are biased and weighted such that changes in the state of in-phase clock signal ck0 611, and subsequently, changes in the state of switches $605_1$ and $603_1$, have no impact on the voltage at $V_{intep}$ 615. Second waveform 704 can therefore represent a pass through of the phase of quadrature-phase clock signal ck90 613. Waveforms 700 further shows a set of six interpolation waveforms 706 that represent a range of interpolation settings (e.g., biasings and weightings of current sources and sinks) between first waveform 702 (e.g., phase of in-phase clock ck0 611) and second waveform 704 (e.g., phase of quadrature-phase clock ck90 613). All waveforms 702, 704, and 706 exhibit constant slopes at the zero crossing in both directions which contribute to a high phase step linearity.

Figure 8:
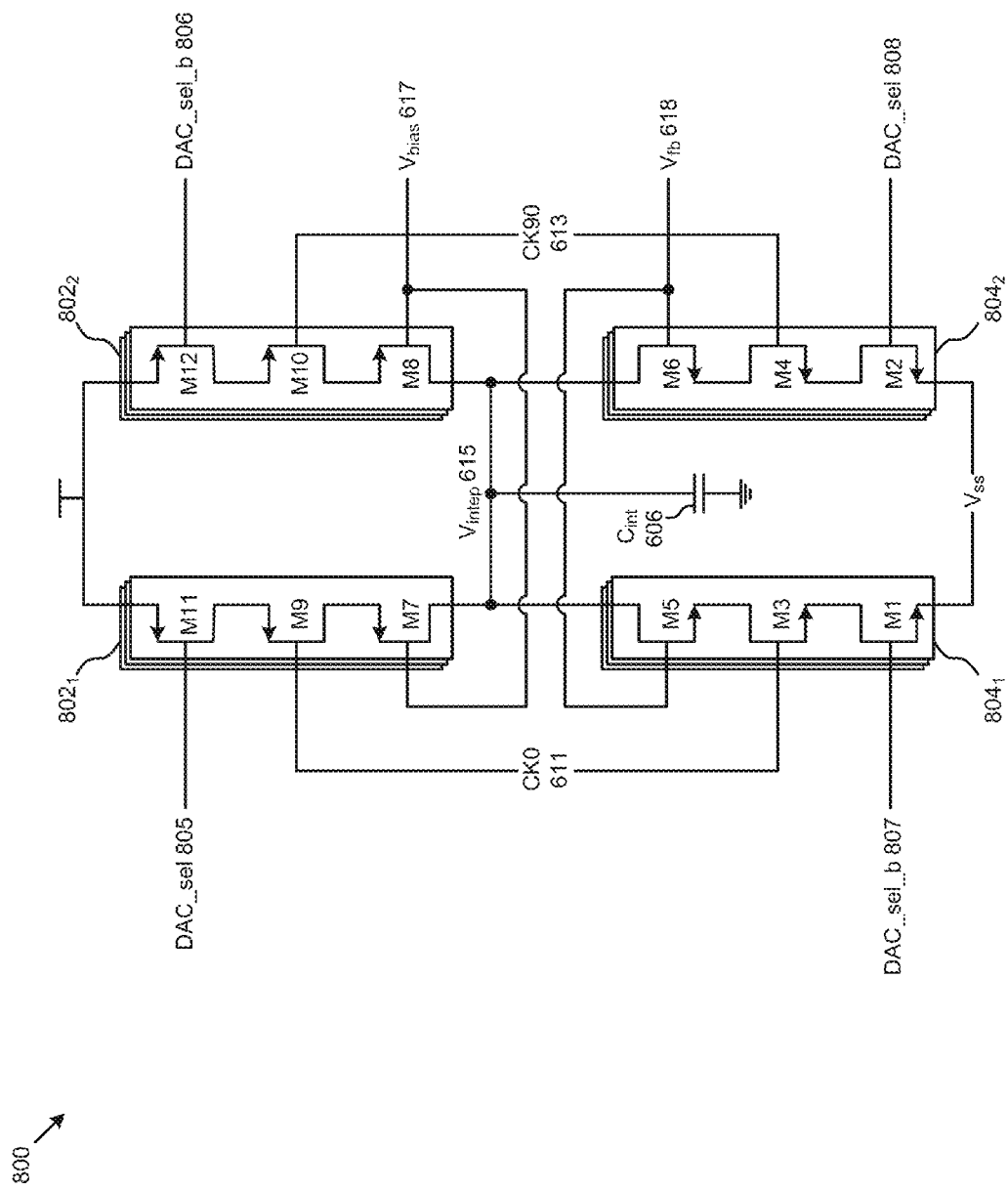
FIG. 8 is a basic transistor-level schematic of a full-wave integrating phase interpolation core as used to implement various high performance phase interpolators, according to some embodiments.

FIG. 8 is a basic transistor-level schematic 800 of full-wave integrating phase interpolation core 601 as used to implement various high performance phase interpolators. As an option, one or more instances of elements of schematic 800, or interpolation core 601, or any aspect thereof may be implemented in the context of the architecture and functionality of the embodiments described herein.

As shown in FIG. 8, schematic 800 shows that full-wave integrating phase interpolation core 601 comprises an in-phase source current DAC $802_1$, a quadrature-phase source current DAC $802_2$, an in-phase sink current DAC $804_1$, and a quadrature-phase sink current DAC $804_2$. In some embodiments, current DACs $802_1$, $802_2$, $804_1$, and $804_2$, are fully segmented with unary or thermometer encoding. Current DACs $804_1$ and $804_2$ can also be called multiplying DACs. The basic functional transistors for a single representative bit slice of each current DAC $802_1$, $802_2$, $804_1$, and $804_2$ are shown in schematic 800 for illustrative purposes. Specifically, each bit slice comprises three basic functional transistors: a first transistor acting as a switch responsive to a DAC control bit, a second transistor acting as a switch responsive to an input clock, and a third transistor acting as a bias current control responsive to a control voltage. A current source or sink will be actively sourcing or sinking current to support $V_{intep}$ 615 when the two switch transistors are both activated (e.g., closed or conducting). More specifically, referring to schematic 800, transistors M11 and M12 act as switches responsive to a DAC control bit and receive DAC control bit signals DAC_sel 805 and DAC_sel_b 806, respectively. Transistors M1 and M2 also act as switches responsive to a DAC control bit and receive DAC control bit signals DAC_sel_b 807 and DAC_sel 808, respectively. Transistors M9 and M3 act as switches responsive to an input clock and receive in-phase clock signal ck0 611. Transistors M10 and M4 also act as switches responsive to an input clock and receive quadrature-phase clock signal ck90 613. Transistors M7 and M8 act as bias current control responsive to a control voltage and receive current bias reference voltage $V_{bias\_ref}$ 617. Transistors M5 and M6 also act as bias current control responsive to a control voltage and receive feedback voltage $V_{ctrl\_fb}$ 618.

Full-wave integrating phase interpolation core 601 operates within its linear region or output compliance range by controlling the supplied bias current ($I_{bias}$) and the resulting peak-to-peak amplitude of the waveform at $V_{intep}$ 615 ($V_{intep-pp}$) according the following relationship:

$$V_{intep-pp}=(2*I_{bias})/(C_{int}*F_{ck}) \quad [\text{EQ. 2}]$$

where,
$C_{int}$=value of $C_{int}$ 606, and
$F_{ck}$=interpolator clock frequency The interpolator output amplitude is therefore inversely related to the interpolator clock frequency and value of the integrating capacitor. Variations in $F_{ck}$ and $C_{int}$ 606 can therefore impact output amplitude which can degrade PSR and phase step linearity. To maintain an optimal amplitude over a wide range of $F_{ck}$, some embodiments can deploy a switched capacitor frequency-to-current converter having an output current inversely proportional to $F_{ck}$ and providing the bias current $I_{bias}$ for interpolation core 601. To mitigate amplitude variations due to capacitor value variance (e.g., in $C_{int}$ 606), some embodiments can deploy a switched capacitor frequency-to-current converter having an output current that is dependent on the same type of capacitor as that used in the integrating capacitor of the interpolation core. Thus, full-wave integrating phase interpolation core 601 can exhibit good PSR and phase step linearity over a wide frequency range and process variation range.

Further, the cascode configuration of current DACs $802_1$, $802_2$, $804_1$, and $804_2$ within full-wave integrating phase interpolation core 601 is vital to providing several high performance features to phase interpolators deploying this design. For example, complementary switching among the current DACs in the cascode configuration significantly reduces clock (e.g., ck0 611 and ck90 613) feed-through to $V_{intep}$ 615. Further, the cascode configuration is characterized by a high output impedance which in turn provides a high PSR, as well as a high single-stage gain, resulting in a high-fidelity triangle waveform at $V_{intep}$ 615 and highly linear interpolation phase steps (e.g., see FIG. 7).

Figure 9A:
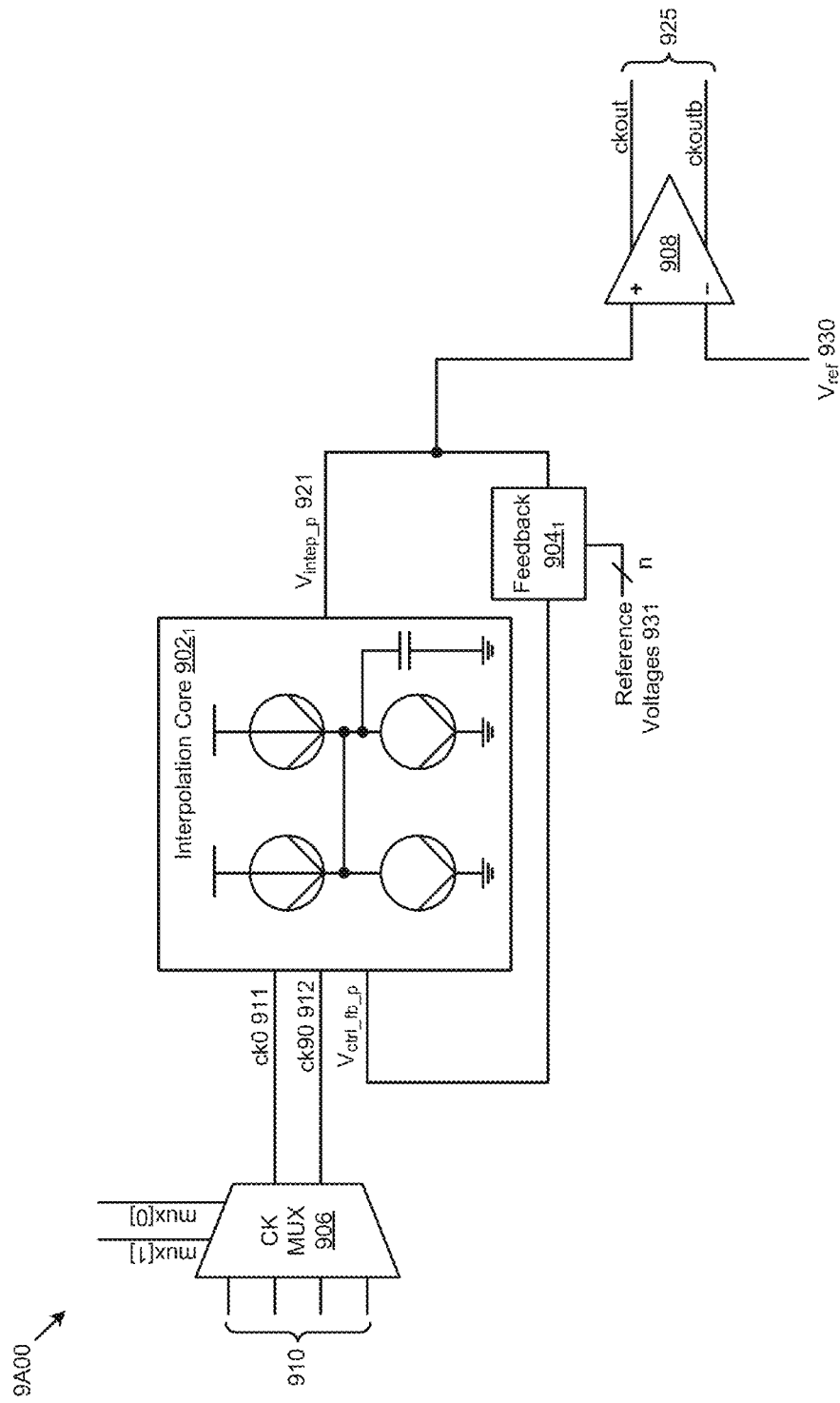
FIG. 9A is a schematic of a single-core full-wave integrating phase interpolator used to implement various high performance phase interpolators, according to some embodiments.

FIG. 9A is a schematic of a single-core full-wave integrating phase interpolator 9A00 used to implement various high performance phase interpolators. As an option, one or more instances of elements of single-core full-wave integrating phase interpolator 9A00 or any aspect thereof may be implemented in the context of the architecture and functionality of the embodiments described herein.

As shown in FIG. 9A, single-core full-wave integrating phase interpolator 9A00 comprises a first full-wave integrating phase interpolation core $902_1$, a first feedback circuit $904_1$, a clock multiplexer 906, and a comparator 908. Interpolation core $902_1$ has the same architecture, and thus the same inherent advantages, as that of full-wave integrating phase interpolation core 601 shown in FIG. 6 and described herein. Interpolation core $902_1$ further connects to and interacts with feedback circuit $904_1$ in the same manner as full-wave integrating phase interpolation core 601 and feedback circuit 607 shown in FIG. 6 and described herein. Interpolation core $902_1$ receives a first in-phase clock ck0 911 and a first quadrature-phase clock ck90 912 to produce a first interpolation voltage waveform $V_{intep\_p}$ 921. Clocks ck0 911 and ck90 912 are selected from a set of reference clocks 910 by clock multiplexer 906. The waveform (e.g., triangle wave) at voltage $V_{intep\_p}$ 921 is compared to a reference voltage $V_{ref}$ 930 at comparator 908 to generate a differential digital interpolation clock output 925 with edges or transitions at the crossing points of $V_{intep\_p}$ 921 and $V_{ref}$ 930. In some embodiments, reference voltage $V_{ref}$ 930 can be related to a set of reference voltages 931 received at feedback circuit $904_1$.

Single-core full-wave integrating phase interpolator 9A00 described herein offers many advantages. The high PSR, linearity, and signal integrity inherent in interpolation core $902_1$ is maintained by remaining in a compliant linear or analog operating region until the final generation of clock output 925 by comparator 908. Designing comparator 908 to have a high gain, a non-saturating first stage, and a good common-mode rejection, can help maintain a high PSR for the entire interpolator system. Voltage $V_{ref}$ 930 can also be adjusted to correct for clock output 925 duty cycle deviations due to input offset voltages of comparator 908, feedback gain variations of circuit $904_1$, mismatches in the DAC currents of core $902_1$, and the like. Duty cycle correction is discussed further in reference to FIG. 12A and FIG. 12B.

Figure 9B:
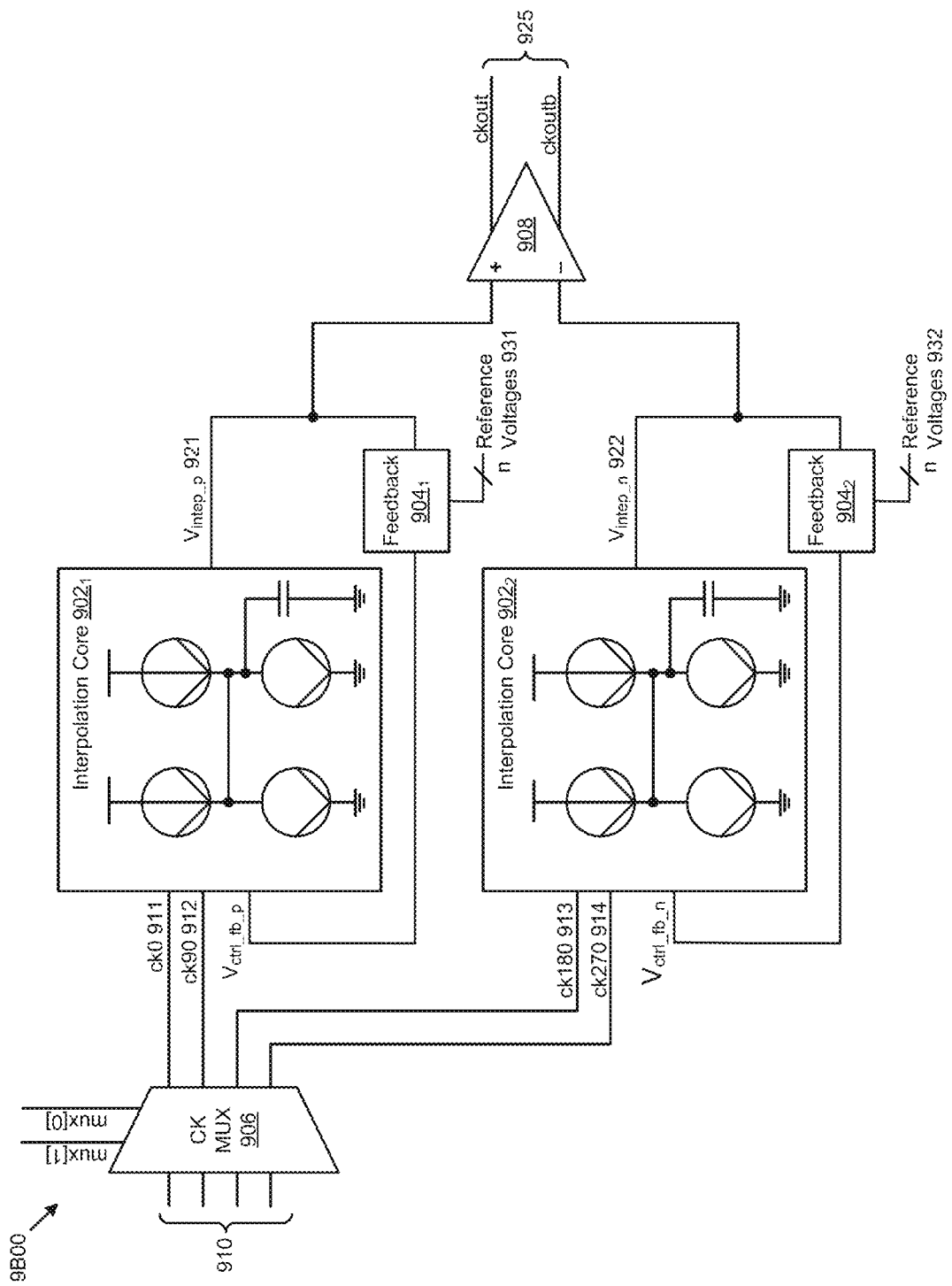
FIG. 9B is a schematic of a dual-core full-wave integrating phase interpolator used to implement various high performance phase interpolators, according to some embodiments.

FIG. 9B is a schematic of a dual-core full-wave integrating phase interpolator 9B00 used to implement various high performance phase interpolators. As an option, one or more instances of elements of dual-core full-wave integrating phase interpolator 9B00 or any aspect thereof may be implemented in the context of the architecture and functionality of the embodiments described herein.

As shown in FIG. 9B, dual-core full-wave integrating phase interpolator 9B00 comprises the same components as single-core full-wave integrating phase interpolator 9A00 with additional components that comprise the second core and related support circuitry. Specifically, dual-core full-wave integrating phase interpolator 9B00 comprises a first full-wave integrating phase interpolation core $902_1$, a second full-wave integrating phase interpolation core $902_2$, a first feedback circuit $904_1$, a second feedback circuit $904_2$, a clock multiplexer 906, and a comparator 908. Interpolation cores $902_1$ and $902_2$ have the same architecture, and thus the same inherent advantages, as that of full-wave integrating phase interpolation core 601 shown in FIG. 6 and described herein. Interpolation cores $902_1$ and $902_2$ further connect to and interact with feedback circuits $904_1$ and $904_2$, respectively, in the same manner as full-wave integrating phase interpolation core 601 and feedback circuit 607 shown in FIG. 6 and described herein. Interpolation core $902_1$ receives a first in-phase clock ck0 911 and a first quadrature-phase clock ck90 912 to produce a first interpolation voltage waveform $V_{intep\_p}$ 921. Interpolation core $902_2$ receives a second in-phase clock ck180 913 and a second quadrature-phase clock ck270 914 to produce a second interpolation voltage waveform $V_{intep\_n}$ 922. Clocks ck0 911, ck90 912, ck180 913, and ck270 914 are selected from a set of reference clocks 910 by clock multiplexer 906. The phase of clock ck180 913 is shifted by $\pi$ radians or 180 degrees relative to the phase of clock ck0 911. Similarly, the phase of clock ck270 914 is shifted by $\pi$ radians or 180 degrees relative to the phase of clock ck90 912. The waveforms (e.g., triangle waves) at voltages $V_{intep\_p}$ 921 and $V_{intep\_n}$ 922 will therefore also be offset such that they are largely the inverse of one another (e.g., like a differential signal), allowing comparator 908 to generate an accurate differential digital interpolation clock output 925 with edges or transitions at the crossing points of $V_{intep\_p}$ 921 and $V_{intep\_n}$ 922. In some embodiments, a set of reference voltages 931 received at first feedback circuit $904_1$ can be related to a set of reference voltages 932 received at second feedback circuit $904_2$.

Dual-core full-wave integrating phase interpolator 9B00 described herein offers many advantages. The high PSR, linearity, and signal integrity inherent in interpolation cores $902_1$ and $902_2$ is maintained by remaining in a linear or analog operating region until the final generation of clock output 925 by comparator 908. Designing comparator 908 to have a high gain, a non-saturating first stage, and a good common-mode rejection, can help maintain a high PSR for the entire interpolator system. The common zero-crossing point and pseudo-differential nature of the waveforms at $V_{intep\_p}$ 921 and $V_{intep\_n}$ 922 not only improve PSR, but also increase the effective waveform slope at the phase transition or switch point, reducing sensitivity to amplitude-induced jitter in cores $902_1$ and $902_2$.

Figure 10:
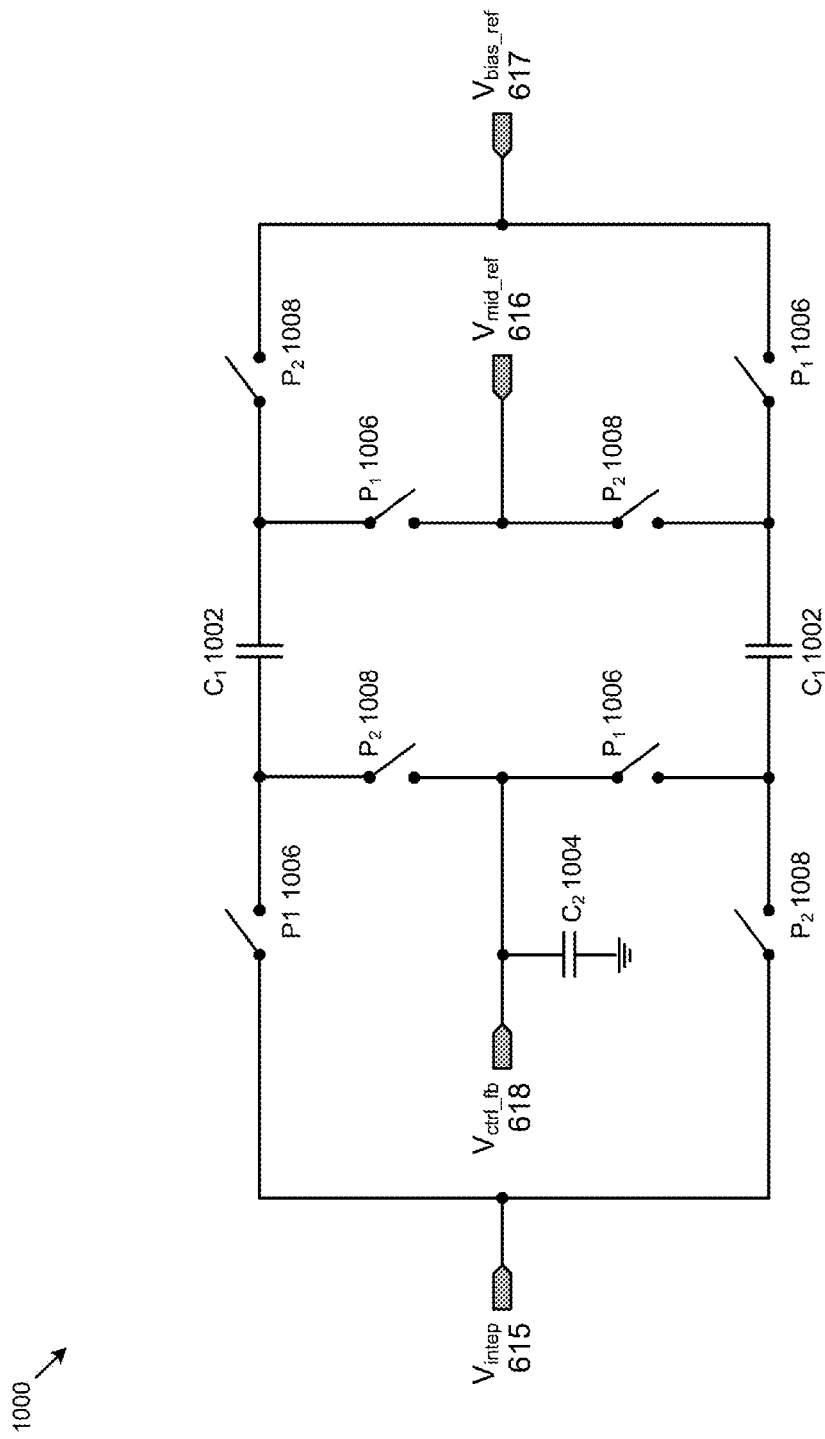
FIG. 10 exemplifies a switched capacitor feedback circuit for implementing high performance phase interpolators, according to one embodiment.

FIG. 10 exemplifies a switched capacitor feedback circuit 1000 for implementing high performance phase interpolators. As an option, one or more instances of switched capacitor feedback circuit 1000 or any aspect thereof may be implemented in the context of the architecture and functionality of the embodiments described herein. Also, switched capacitor feedback circuit 1000 or any aspect thereof may be implemented in any desired environment. The figure depicts a switched capacitor output voltage control circuit for the phase interpolator. In some embodiments, feedback circuit 607 of full-wave integrating phase interpolator 600 can comprise circuit 1000. The following describes such embodiments.

As shown in FIG. 10, and with reference to FIG. 6, switched capacitor feedback circuit 1000 receives interpolation voltage $V_{intep}$ 615, midpoint reference voltage $V_{mid\_ref}$ 616, and current bias reference voltage $V_{bias\_ref}$ 617, and drives feedback voltage $V_{ctrl\_fb}$ 618. The simplified schematic of circuit 1000 comprises a storage capacitor set C1 1002, a load capacitor C2 1004, a first set of switches responding to a first activation pulse P1 1006, and a second set of switches responding to a second activation pulse P2 1008. Storage capacitor set C1 1002 comprises two identical capacitors symmetric about the output node at $V_{ctrl\_fb}$ 618 to optimize the performance (e.g., consistent load impedance during pulse P1 1006 and pulse P2 1008) of circuit 1000. One purpose of circuit 1000 is to sense voltages $V_{intep}$ 615, $V_{mid\_ref}$ 616, and $V_{bias\_ref}$ 617, and drive feedback voltage $V_{ctrl\_fb}$ 618 such that the performance of interpolation core 601 is optimized through control of the common mode voltage level at $V_{intep}$ 615.

Figure 11:
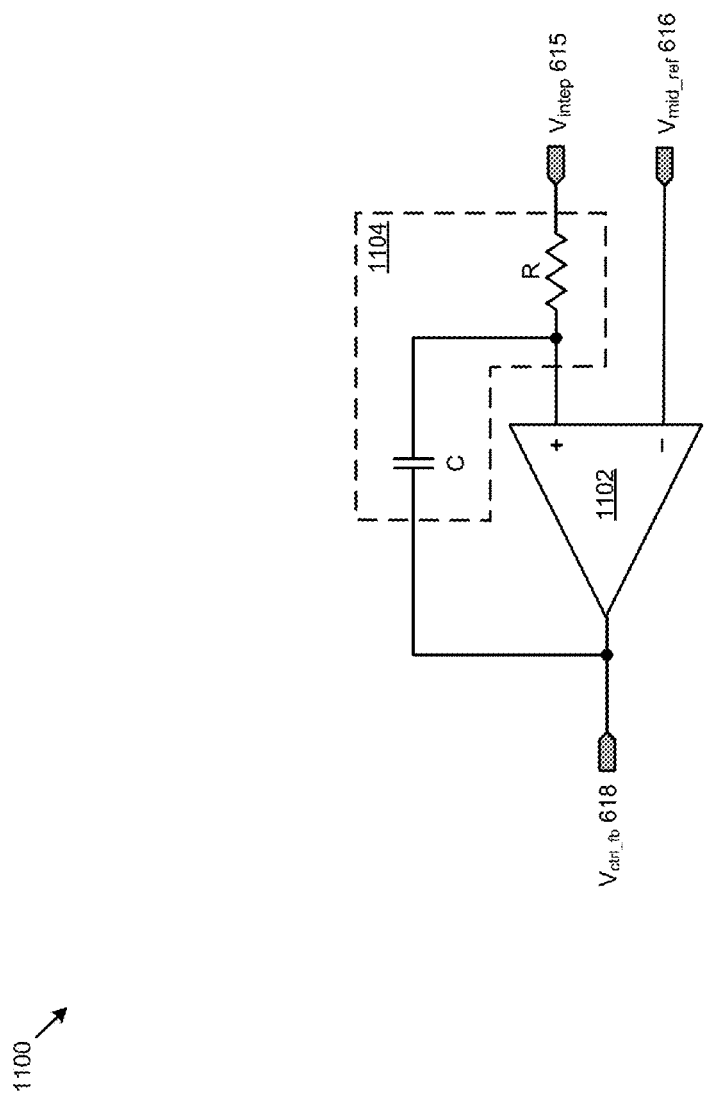
FIG. 11 exemplifies a linear feedback circuit for implementing high performance phase interpolators, according to one embodiment.

FIG. 11 exemplifies a linear feedback circuit 1100 for implementing high performance phase interpolators. As an option, one or more instances of linear feedback circuit 1100 or any aspect thereof may be implemented in the context of the architecture and functionality of the embodiments described herein. Also, linear feedback circuit 1100 or any aspect thereof may be implemented in any desired environment. The figure depicts a linear output voltage control circuit for the phase interpolator. In some embodiments, feedback circuit 607 of full-wave integrating phase interpolator 600 can comprise circuit 1100. The following describes such embodiments.

As shown in FIG. 11, and with reference to FIG. 6, linear feedback circuit 1100 receives interpolation voltage $V_{intep}$ 615 and midpoint reference voltage $V_{mid\_ref}$ 616, and drives feedback voltage $V_{ctrl\_fb}$ 618. The simplified schematic of circuit 1100 comprises an operational amplifier or op amp 1102 and a linear low pass RC filter 1104. One purpose of circuit 1100 is to sense voltages $V_{intep}$ 615 and $V_{mid\_ref}$ 616, and drive feedback voltage $V_{ctrl\_fb}$ 618 such that the performance of the interpolation core 601 is optimized through control of the common mode voltage level at $V_{intep}$ 615. Specifically, the waveform (e.g., large amplitude triangle wave) at $V_{intep}$ 615 is transferred by RC filter 1104 to a DC voltage representing the common mode of the interpolation output voltage and delivered to the negative input of op amp 1102. An adjustable reference voltage $V_{mid\_ref}$ 616 representing the target common-mode or crossing voltage is delivered to the positive input of op amp 1102. Op amp 1102 is configured to compare the actual common mode voltage at the negative input to the target common mode voltage at the positive input and drive an output voltage at $V_{ctrl\_fb}$ 618 within the closed loop of circuit 1100 and the entire interpolator system, such that the actual common-mode voltage equals the target common-mode voltage in steady state.

Figure 12A:
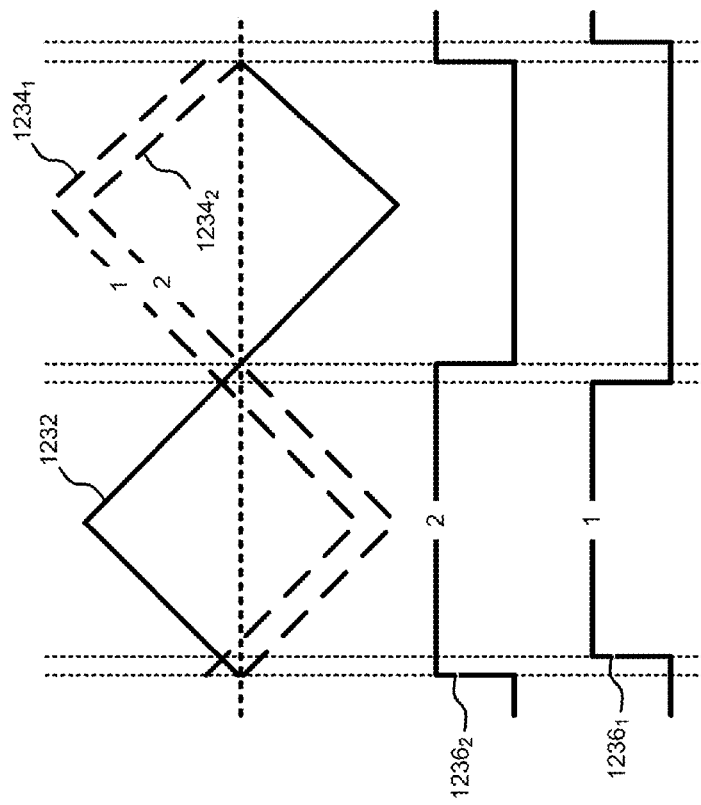
FIG. 12A depicts selected waveforms exhibiting duty cycle correction, according to one embodiment.

FIG. 12A depicts selected waveforms 12A00 exhibiting duty cycle correction of dual-core full-wave integrating phase interpolator 9B00. Specifically, waveforms 12A00 represent the voltages at $V_{intep\_p}$ 921 and $V_{intep\_n}$ 922, and the digital output signal of interpolation clock output 925, to illustrate the impact of interpolator offsets on duty cycle. For example, a first core output waveform 1232 can represent the voltage at $V_{intep\_p}$ 921, a second core output with offset waveform $1234_1$ can represent the voltage at $V_{intep\_n}$ 922 when a common-mode offset exists, and an output clock with offset waveform $1236_1$ can represent the digital output signal of interpolation clock output 925 responsive to waveforms 1232 and $1234_1$. The common-mode offset present in waveform $1234_1$ results in a shift in the zero crossing of pseudo-differential waveforms 1232 and $1234_1$ such that waveform $1236_1$ exhibits a duty cycle less than 50%. By controlling the common mode of interpolation cores $902_1$ and $902_2$ in interpolator 9B00 (e.g., through feedback circuits $904_1$ and $904_2$) this duty cycle deviation can be corrected. A corrected duty cycle is illustrated in waveforms 12A00 with a second core output with corrected offset waveform $1234_2$ representing the voltage at $V_{intep\_n}$ 922 when a common-mode offset is corrected, and an output clock with corrected offset waveform $1236_2$ representing the digital output signal of interpolation clock output 925 responsive to waveforms 1232 and $1234_2$. With the common-mode offset corrected, the zero crossing of pseudo-differential waveforms 1232 and $1234_2$ are such that waveform $1236_2$ exhibits a duty cycle of 50%. Techniques for duty cycle correction and calibration are disclosed in FIG. 12B and the corresponding description as follows.

Figure 12B:
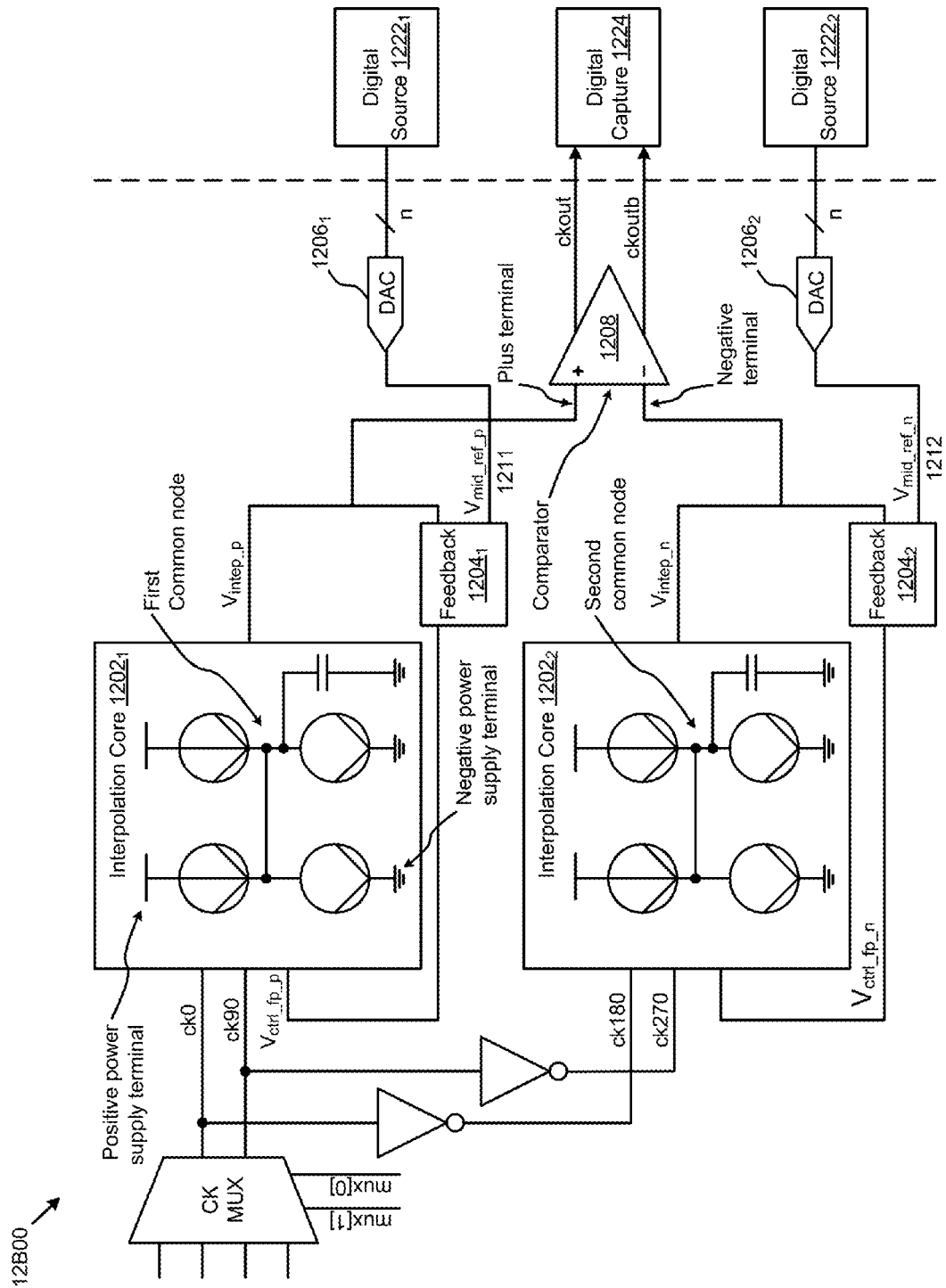
FIG. 12B exemplifies a duty cycle calibration setup for calibrating certain embodiments of an instance of a high performance phase interpolator.

FIG. 12B exemplifies a duty cycle calibration setup 12B00 for calibrating an instance of a high performance phase interpolators. As an option, one or more instances of duty cycle calibration setup 12B00 or any aspect thereof may be implemented in the context of the architecture and functionality of the embodiments described herein. Also, duty cycle calibration setup 12B00 or any aspect thereof may be implemented in any desired environment.

As shown in FIG. 12B, duty cycle calibration setup 12B00 comprises a high performance phase interpolator, similar to dual-core full-wave integrating phase interpolator 9B00, having a first full-wave integrating phase interpolation core $1202_1$, a second full-wave integrating phase interpolation core $1202_2$, a first feedback circuit $1204_1$, a second feedback circuit $1204_2$, and a comparator 1208. Setup 12B00 further comprises a first voltage control DAC $1206_1$ controlling a voltage $V_{mid\_ref\_p}$ 1211 of first feedback circuit $1204_1$, and a second voltage control DAC $1206_2$ controlling a voltage $V_{mid\_ref\_n}$ 1212 of second feedback circuit $1204_1$. Voltage control DACs $1206_1$ and $1206_2$ are used to precisely and accurately control voltages $V_{mid\_ref\_p}$ 1211 and $V_{mid\_ref\_n}$ 1212, respectively, to correct for clock output duty cycle deviations due to input offset voltages of comparator 1208, feedback gain variations of circuits $1204_1$ and $1204_2$, mismatches in the DAC currents of cores $1202_1$ and $1202_2$, and the like. In some embodiments, voltage control DACs $1206_1$ and $1206_2$ can be implemented as charge-redistribution DACs when feedback circuits $1204_1$ and $1204_2$ are of a switched capacitor type similar to that described in FIG. 10. Other controllable precision voltage sources (e.g., trimmable voltage regulators) can also be used to drive voltages $V_{mid\_ref\_p}$ 1211 and $V_{mid\_ref\_n}$ 1212.

Setup 12B00 can be implemented within a calibration environment. Such a calibration environment might comprise instrumentation to assist in determining the voltages $V_{mid\_ref\_p}$ 1211 and $V_{mid\_ref\_n}$ 1212 required to achieve the target duty cycle (e.g., 50%) of the interpolator clock output or other performance attributes of the interpolator. Specifically, the setup 12B00 of FIG. 12B comprises a first digital signal source $1222_1$ connected to and controlling DAC $1206_1$, a second digital signal source $1222_2$ connected to and controlling DAC $1206_2$, and a digital signal capture instrument 1224 connected to and sensing the state of the digital output of comparator 1208. In some situations, a calibration environment can be implemented on-chip with the interpolator (e.g., within a single semiconductor package, in a multi-chip package with the interpolator, etc.) or a calibration environment can be implemented off-chip (e.g., in a testing environment).

The dual-core full-wave integrating phase interpolator in setup 12B00 offers several features related to duty cycle correction and calibration. Specifically, no time measurement instrumentation is required to calibrate duty cycle, optimizing test and calibration costs in terms of throughput and test equipment costs. More specifically, to determine the optimal voltages $V_{mid\_ref\_p}$ 1211 and $V_{mid\_ref\_n}$ 1212, the current DACs of interpolation cores $1202_1$ and $1202_2$ are first enabled at half strength (e.g., the input clocks are disabled). Digital sources $1222_1$ and $1222_2$ are then used to control DACs $1206_1$ and $1206_2$, and in turn, adjust voltages $V_{mid\_ref\_p}$ 1211 and $V_{mid\_ref\_n}$ 1212, until digital capture instrument 1224 senses a state change at the output of comparator 1208. The voltages $V_{mid\_ref\_p}$ 1211 and $V_{mid\_ref\_n}$ 1212 at this switch point are the best voltages to correct for any offsets in the system that may contribute to duty cycle deviations. In some test environments, a search (e.g., binary search, successive approximation search) for the optimal voltages at $V_{mid\_ref\_p}$ 1211 and $V_{mid\_ref\_n}$ 1212 can be completed in a few passes, requiring only a few milliseconds. Search instrumentation and search logic can also be implemented on-chip. In some embodiments, the digital settings of DACs $1206_1$ and $1206_2$ corresponding to the desired correction voltages $V_{mid\_ref\_p}$ 1211 and $V_{mid\_ref\_n}$ 1212 can be stored in on-chip memory (e.g., EPROM). Finally, in some embodiments, conventional on-chip duty cycle error detectors can also be implemented to provide continuous adjustment of voltages $V_{mid\_ref\_p}$ 1211 and $V_{mid\_ref\_n}$ 1212 for the dual-core full-wave integrating phase interpolator described herein.

The embodiment of FIG. 12B can be implemented in a packaged semiconductor device that includes one or more phase interpolation devices. Such a device is powered by a first voltage from a positive power supply terminal, a second voltage from a negative power supply terminal. The power is supplied to an interpolation device as well as to other devices implemented in the same package (e.g., on the same or on different die). The shown interpolation device includes a first interpolation core comprising a positive in-phase cascode current source having a positive in-phase input coupled to the positive power supply terminal through a programmable positive in-phase control, and having a positive in-phase output coupled to a first common node. Also, the shown interpolation device includes a positive quadrature phase cascode current source having a positive quadrature phase input coupled to the positive power supply terminal through a programmable positive quadrature phase control, and having a positive quadrature phase output coupled to the first common node.

A 50/50 duty cycle is implemented by adding a negative in-phase cascode current source having a negative in-phase input coupled to the negative power supply terminal through a programmable negative in-phase control, and having a negative in-phase output coupled to the first common node. A negative quadrature phase cascode current source having a negative quadrature phase input is coupled to the negative power supply terminal through a programmable negative quadrature phase control. The negative quadrature phase output is coupled to the first common node.

Full-wave integrating interpolation is implemented by including a second interpolation core having a second common node (as shown) and a comparator having a plus terminal, a negative terminal, and a phase interpolation output. The plus terminal of the comparator is coupled to the first common node and negative terminal of the comparator is coupled to the second common node.

Duty cycle correction for phase interpolation device is implemented by adding a first common mode feedback circuit coupled to the first common node and a second common mode feedback circuit coupled to the second common node. The first common mode feedback circuit comprises a first common mode voltage generator; and the second common mode feedback circuit comprises a second common mode voltage generator.

Any of the foregoing design choices or features can be implemented in a semiconductor package comprising one or more die.

Finally, it should be noted that there are alternative ways of implementing the embodiments disclosed herein. Accordingly, the present embodiments are to be considered as illustrative and not restrictive, and the claims are not to be limited to the details given herein, but may be modified within the scope and equivalents thereof.

In the foregoing specification, the disclosure has been described with reference to specific embodiments thereof. It will, however, be evident that various modifications and changes may be made thereto without departing from the broader spirit and scope of the disclosure. For example, the above-described schematics and circuits are described with reference to a particular set of named signals and named waveforms. However, the set of named signals and waveforms may be changed without affecting the scope or operation of the disclosed techniques. The specification and drawings are, accordingly, to be regarded in an illustrative sense rather than in a restrictive sense.

What is claimed is:

1. A method for designing a low power phase interpolator that exhibits high power supply rejection, the method comprising:

configuring a first interpolation module having a first interpolation module output by,
identifying a positive in-phase current source having a positive in-phase input and receiving power from a positive power supply terminal to produce a positive in-phase output operatively through a positive in-phase control;
identifying a positive quadrature phase current source having a positive quadrature phase input and receiving power from the positive power supply terminal to produce a positive quadrature phase output operatively through a positive quadrature phase control put;
identifying a negative in-phase current source having a negative in-phase input and receiving power from a negative power supply terminal to produce a negative in-phase output operatively through a negative in-phase control; and
identifying a negative quadrature phase current source having a negative quadrature phase input and receiving power from the negative power supply terminal to produce a negative quadrature phase output operatively through a negative quadrature phase control;
configuring a second interpolation module having a second interpolation module output; and
performing a comparison operation by comparing the second interpolation module output to the first interpolation module output to generate a phase interpolation output, wherein the first interpolation module output is a common node for combining the positive in-phase output, the positive quadrature phase output, the negative in-phase output, and the negative quadrature phase output.

2. The method of claim 1, further comprising:
providing a plurality of clock inputs; and
configuring a multiplexer module coupled to the first interpolation module and to the second interpolation module, the multiplexer being configured to select one of the plurality of clock inputs.

3. The method of claim 2 wherein the comparison operation generates a clock output based at least on the one of the plurality of clock inputs.

4. The method of claim 3, wherein the comparison operation is configured to operate a voltage comparator in a linear range.

5. The method of claim 1, further comprising configuring a first common mode feedback circuit coupled to the first interpolation module output and a second common mode feedback circuit coupled to the second interpolation module output.

6. The method of claim 5, wherein the first common mode feedback circuit comprises a first common mode feedback signal generator and the second common mode feedback circuit comprises a second common mode feedback signal generator.

7. The method of claim 6, wherein the first common mode feedback signal generator comprises a first voltage generator.

8. The method of claim 7, wherein the second common mode feedback signal generator comprises a second voltage generator.

9. The method of claim 8, wherein each of the first common mode feedback circuit and the second common mode feedback circuit outputs a feedback control signal.

10. The method of claim 8 wherein at least one of, the first voltage generator, or the second voltage generator is coupled to a digital to analog converter.

11. The method of claim 10, wherein each of the first common mode feedback circuit and the second common mode feedback circuit receives a reference signal.

12. The method of claim 11, wherein the reference signal is an output of the digital-to-analog converter.

13. The method of claim 12, wherein the digital-to-analog converter receives a correction voltage value that is stored in an EEPROM memory location.

14. The method of claim 12, wherein the digital-to-analog converter receives a correction voltage value that is stored in a non-EEPROM memory location.

15. A non-transitory computer readable medium, the non-transitory computer readable medium having stored thereon a sequence of instructions which, when stored in a memory and executed by a processor causes the processor to perform a set of acts for designing a low power phase interpolator that exhibits high power supply rejection, the acts comprising:
configuring a first interpolation module having a first interpolation module output by,
identifying a positive in-phase current source having a positive in-phase input and receiving power from a positive power supply terminal to produce a positive in-phase output operatively through a positive in-phase control;
identifying a positive quadrature phase current source having a positive quadrature phase input and receiving power from the positive power supply terminal to produce a positive quadrature phase output operatively through a positive quadrature phase control;
identifying a negative in-phase current source having a negative in-phase input and receiving power from a negative power supply terminal to produce a negative in-phase output operatively through a negative in-phase control; and
identifying a negative quadrature phase current source having a negative quadrature phase input and receiving power from the negative power supply terminal to produce a negative quadrature phase output operatively through a negative quadrature phase control;
configuring a second interpolation module having a second interpolation module output; and
performing a comparison operation by comparing the second interpolation module output to the first interpolation module output to generate a phase interpolation output, wherein the first interpolation module output is a common node for combining the positive in-phase output, the positive quadrature phase output, the negative in-phase output, and the negative quadrature phase output.

16. The non-transitory computer readable medium of claim 15, further comprising configuring a first feedback circuit and a second feedback circuit that are operatively coupled respectively to the first interpolation module and the second interpolation module to respectively produce a first feedback signal and a second feedback signal.

17. The non-transitory computer readable medium of claim 15, further comprising:
providing a plurality of clock inputs; and
configuring a multiplexer coupled to the first interpolation module and to the second interpolation module, the multiplexer being configured to select one of the plurality of clock inputs.

* * * * *